(12) United States Patent
Sneh

(10) Patent No.: US 7,662,233 B2
(45) Date of Patent: Feb. 16, 2010

(54) ALD APPARATUS AND METHOD

(76) Inventor: Ofer Sneh, 7831 Raven Ct., Boulder, CO (US) 80303

( * ) Notice: Subject to any disclaimer, the term of this patent is extended or adjusted under 35 U.S.C. 154(b) by 236 days.

(21) Appl. No.: 10/561,758

(22) PCT Filed: Jun. 28, 2004

(86) PCT No.: PCT/US2004/020630

§ 371 (c)(1),
(2), (4) Date: Mar. 8, 2007

(87) PCT Pub. No.: WO2005/003406

PCT Pub. Date: Jan. 13, 2005

(65) Prior Publication Data

US 2007/0269983 A1 Nov. 22, 2007

Related U.S. Application Data

(60) Provisional application No. 60/483,152, filed on Jun. 27, 2003.

(51) Int. Cl.
*C23C 16/448* (2006.01)
(52) U.S. Cl. ............... 118/724; 118/733; 117/201; 427/8; 427/9; 427/248.1
(58) Field of Classification Search ............... 427/8, 427/9, 248.1; 118/715, 726, 733
See application file for complete search history.

(56) References Cited

U.S. PATENT DOCUMENTS

| | | | |
|---|---|---|---|
| 4,058,430 A | | 11/1977 | Suntola et al. |
| 4,389,973 A | | 6/1983 | Suntola et al. |
| 4,413,022 A | | 11/1983 | Suntola et al. |
| 4,612,206 A | * | 9/1986 | Shimozato et al. ............ 427/9 |
| 4,619,844 A | * | 10/1986 | Pierce et al. ............ 427/248.1 |
| 4,620,984 A | * | 11/1986 | Hoddinott ............ 427/9 |
| 4,720,432 A | * | 1/1988 | VanSlyke et al. ............ 428/457 |
| 4,842,827 A | * | 6/1989 | Graf et al. ............ 422/112 |
| 4,858,556 A | * | 8/1989 | Siebert ............ 118/664 |

(Continued)

FOREIGN PATENT DOCUMENTS

JP       63186872       8/1988

(Continued)

OTHER PUBLICATIONS

Sinkevicius, V. et al., "Control System of the Experimental Research of Deposition Process in Vacuum." Electronics and Electrical Engineering, ISSN 1392-1215, 2007, No. 5(77), pp. 7-10.*

(Continued)

*Primary Examiner*—Bret Chen
(74) *Attorney, Agent, or Firm*—Patton Boggs LLP

(57) ABSTRACT

Improved apparatus and method for SMFD ALD include a method designed to enhance chemical utilization as well as an apparatus that implements lower conductance out of SMFD-ALD process chamber while maintaining full compatibility with standard wafer transport. Improved SMFD source apparatuses (700, 700', 700") and methods from volatile and non-volatile liquid and solid precursors are disclosed, e.g., a method for substantially controlling the vapor pressure of a chemical source (722) within a source space comprising: sensing the accumulation of the chemical on a sensing surface (711); and controlling the temperature of the chemical source depending on said sensed accumulation.

11 Claims, 15 Drawing Sheets

U.S. PATENT DOCUMENTS

| | | | |
|---|---|---|---|
| 4,993,357 A | 2/1991 | Scholz | |
| 5,114,683 A | 5/1992 | Hirase | |
| 5,153,072 A * | 10/1992 | Ratner et al. | 428/461 |
| 5,225,366 A | 7/1993 | Yoder | |
| 5,281,274 A | 1/1994 | Yoder | |
| 5,415,196 A * | 5/1995 | Bryant et al. | 137/14 |
| 5,483,919 A | 1/1996 | Yokoyama et al. | |
| 5,536,317 A | 7/1996 | Crain et al. | |
| 5,558,717 A | 9/1996 | Zhao et al. | |
| 5,563,341 A * | 10/1996 | Fenner et al. | 73/335.11 |
| 5,676,116 A * | 10/1997 | Kim | 123/518 |
| 5,711,811 A | 1/1998 | Suntola et al. | |
| 5,758,680 A | 6/1998 | Kaveh et al. | |
| 5,855,680 A | 1/1999 | Soininen et al. | |
| 5,871,805 A * | 2/1999 | Lemelson | 427/8 |
| 5,928,426 A | 7/1999 | Aitchison | |
| 6,015,590 A | 1/2000 | Suntola et al. | |
| 6,096,371 A * | 8/2000 | Haaland et al. | 427/10 |
| 6,174,377 B1 | 1/2001 | Doering et al. | |
| 6,305,314 B1 | 10/2001 | Sneh et al. | |
| 6,342,277 B1 * | 1/2002 | Sherman | 427/562 |
| 6,347,919 B1 | 2/2002 | Ryan et al. | |
| 6,361,607 B2 | 3/2002 | Dozoretz et al. | |
| 6,409,837 B1 * | 6/2002 | Hillman | 118/712 |
| 6,447,607 B2 | 9/2002 | Soininen et al. | |
| 6,651,488 B2 * | 11/2003 | Larson et al. | 73/61.62 |
| 6,884,458 B2 * | 4/2005 | Liu | 427/9 |
| 6,911,092 B2 | 6/2005 | Sneh | |
| 6,925,346 B1 * | 8/2005 | Mazumder et al. | 700/119 |
| 7,077,563 B2 * | 7/2006 | Xiao et al. | 374/29 |
| 7,537,018 B1 * | 5/2009 | Curran et al. | 137/3 |
| 2002/0076508 A1 | 6/2002 | Chiang et al. | |
| 2002/0172768 A1 * | 11/2002 | Endo et al. | 427/255.28 |
| 2002/0187253 A1 * | 12/2002 | Marcus et al. | 427/8 |
| 2003/0068534 A1 * | 4/2003 | Ohkawa et al. | 428/701 |
| 2004/0126485 A1 * | 7/2004 | Thompson et al. | 427/126.5 |
| 2007/0026134 A1 * | 2/2007 | Shirley et al. | 427/9 |
| 2007/0231460 A1 * | 10/2007 | Ukigaya | 427/8 |

FOREIGN PATENT DOCUMENTS

| | | | |
|---|---|---|---|
| WO | WO 96/41147 | * | 12/1996 |
| WO | WO-03/062490 A2 | | 7/2003 |

OTHER PUBLICATIONS

Khanna, R.K., et al., "Thin-Film Infrared Spectroscopic Method for Low-Temperature Vapor Pressure Measurements". J. Phys. Chem. 1990, 94, pp. 440-442.*

* cited by examiner

FIG. 2a Prior Art Inlet Flow

SMFD Inlet Flow FIG. 2b

SMFD DC Flow

SMFD Pulse and Hold mode

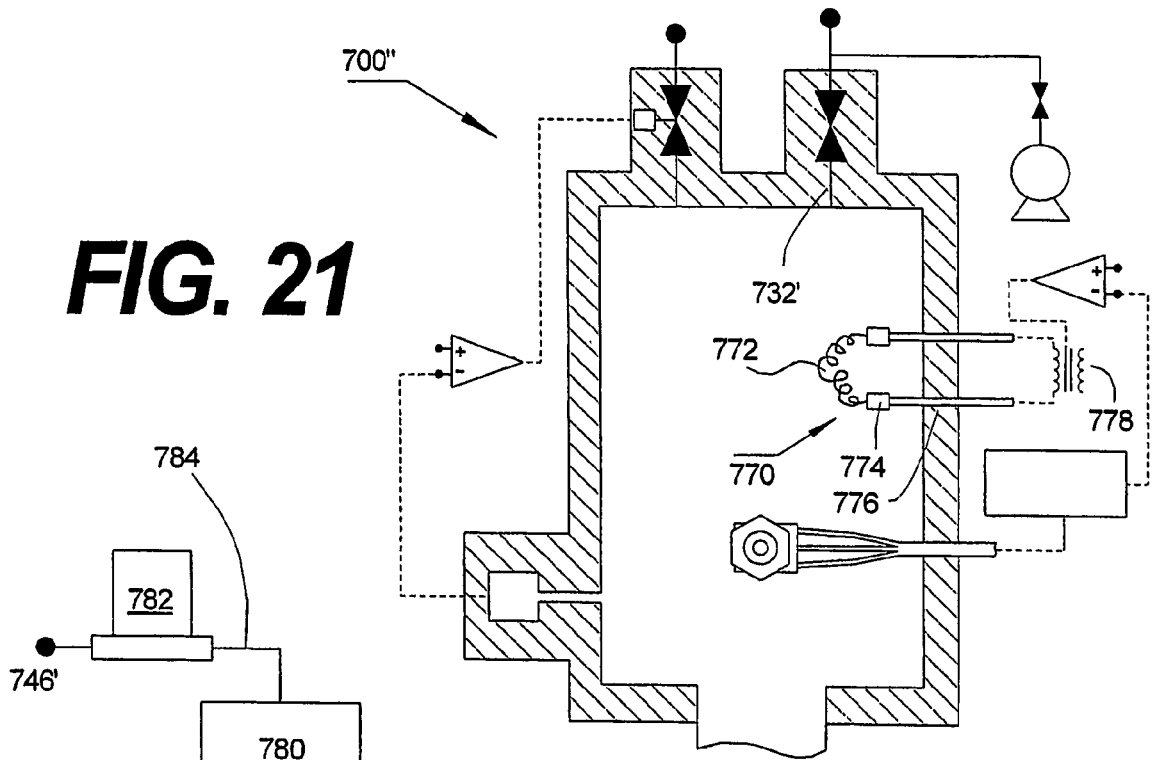

ALD APPARATUS AND METHOD

BACKGROUND OF THE INVENTION

1. Field of the Invention

This invention relates to the field of atomic layer deposition ("ALD"), and more particularly to apparatus and methods for performing ALD with high throughput and low cost.

2. Description of Prior Art

Thin film deposition is commonly practiced in the fabrication of semiconductor devices and many other useful devices. An emerging deposition technique, atomic layer deposition (ALD), offers superior thickness control and conformality for advanced thin film deposition. ALD is practiced by dividing conventional thin-film deposition processes into single atomic-layer deposition steps, named cycles, that are self-terminating and deposit precisely one atomic layer when conducted up to or beyond self-termination exposure times. The deposition per cycle during an ALD process, the atomic layer, typically equals about 0.1 molecular monolayer to 0.5 molecular monolayer. The deposition of atomic layer is the outcome of a chemical reaction between a reactive molecular precursor and the substrate. In each separate ALD reaction-deposition step, the net reaction deposits the desired atomic layer and eliminates the "extra" atoms originally included in the molecular precursor.

In ALD applications, typically two molecular precursors are introduced into the ALD reactor in separate stages. Adequate ALD performance requires that different molecular precursors are not allowed to intermix within the deposition chamber, at the same time. Accordingly, the reaction stages are typically followed by inert-gas purge stages that eliminate the molecular precursors from the chamber prior to the separate introduction of the other precursor.

During the ALD process, films can be layered down in equal metered sequences that are all identical in chemical kinetics, deposition per cycle, composition, and thickness. This mechanism makes ALD insensitive to transport nonuniformity resulting in exceptional thickness control, uniformity and conformality.

If ALD is to become commercially practical an apparatus capable of changing the flux of molecular precursors from one to the other abruptly and fast needs to be available. Furthermore, the apparatus must be able to carry this sequencing efficiently and reliably for many cycles to facilitate cost-effective coating of many substrates. A useful and economically feasible cycle time must accommodate a thickness in a range of about from 3 nm to 30 nm for most semiconductor applications, and even thicker films for other applications. Cost effectiveness dictates that substrates be processed within 2 minutes to 3 minutes, which means that ALD cycle times must be in a range of about from 5 seconds to 0.5 seconds and even less. Multiple technical challenges have so far prevented cost-effective implementation of ALD systems and methods for manufacturing of semiconductor devices and other devices.

Given the need for short cycle times, chemical delivery systems suitable for use in ALD must be able to alternate incoming molecular precursor flows and purges with sub-second response times. The need to achieve short cycle times requires the rapid removal of these molecular precursors from the ALD reactor. Rapid removal in turn dictates that gas residence time in the ALD reactor be minimized. Gas residence times, $\tau$, are proportional to the volume of the reactor, V, the pressure, P, in the ALD reactor, and the inverse of the flow, Q, $\tau=VP/Q$. Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors onto the substrate through the use of a high pressure within the ALD reactor. In addition, both gas residence time and chemical usage efficiency are inversely proportional to the flow. Thus, while lowering flow will increase efficiency, it will also increase gas residence time.

Existing ALD apparatuses have struggled with the trade-off between the need to shorten reaction times and improve chemical utilization efficiency, and on the other hand, the need to minimize purge-gas residence and chemical removal times. Thus, a need exists for an ALD apparatus that can achieve short reaction times and good chemical utilization efficiency, and that can minimize purge-gas residence and chemical removal times.

Existing ALD apparatuses have also struggled with performance deterioration caused by extensive growth of inferior films on the walls of the ALD chambers. This performance deterioration facilitated short equipment uptime and high cost of maintenance. Thus, a need exists for an ALD apparatus that can minimize the growth of deposits and minimize their impact on performance therefore facilitating substantially longer uptime and reduce the cost of maintenance.

Existing ALD apparatuses have struggled with performance deterioration related to slit-valve induced asymmetry with its unavoidable dead-leg cavity. The art of single wafer deposition presents a variety of effective remedies for this problem. For example, U.S. Pat. No. 5,558,717 teaches the advantageous implementation of an annular flow orifice and an annular pumping channel. This annular design requires a relatively wide process-chamber design. In another example, U.S. Pat. No. 6,174,377 describes an ALD chamber designed for wafer loading at a low chuck position, while wafer processing is carried out at a high chuck position, leaving the wafer transport channel, and the flow disturbances associated with it, substantially below the wafer level. Both of these prior art solutions and other prior art solutions are not ideally suited to resolve the slot valve cavity problem in ALD systems.

A better solution implements a ring-shaped slit-valve that creates a substantially symmetric chamber environment. Such embodiment is described in U.S. Pat. No. 6,347,919. However, the ring slit-valve described in U.S. Pat. No. 6,347,919 presents significant performance deterioration that is associated with the presence of unprotected elastomeric seals and the respective crevices between the slide of the ring slit-valve and the chamber wall that is notorious for entrapment of chemicals and the growth of deposits and particulates on the seal and within the crevices. While deterioration of chamber performance related to growth of deposits on slit-valve seals is a universal problem with all existing designs of slit valves, ring-shaped slit-valves as taught in U.S. Pat. No. 6,347,919 substantially aggravate that problem due to substantially longer seals and crevices. Unfortunately, this performance limitation makes the ring-shaped slit-valve that was taught in U.S. Pat. No. 6,347,919 practically unusable for ALD applications.

A substantial improvement that makes ring-shaped and other perimeter slit-valves suitable and advantageous for ALD applications is described in U.S. patent application Ser. No. 10/347575, now U.S. Pat. No. 6,911,092 issued Jun. 28, 2005, which is commonly assigned to Sundew Technologies, Inc., by the inventor of this invention that provides seal and crevice protection during the ALD chemical dose steps, therefore making perimeter slit-valves suitable for Synchronously Modulated Flow-Draw ALD apparatus and method.

Chemical delivery into ALD chambers has been generally been limited to chemicals with substantial vapor pressure. However, many advantageous ALD films rely on molecular precursors that are substantially non-volatile. Accordingly existing ALD systems have struggled with the challenge of consistent chemical delivery of low-volatility molecular precursors as abruptly shaped doses for promoting high productivity ALD processes.

In previous patent applications by the inventor of this invention, U.S. patent application Ser. No. 10/347575, now U.S. Pat. No. 6,911,092 issued Jun. 28, 2005, which is commonly assigned to Sundew Technologies, Inc., and PCT Application No. US03/01548, now PCT Publication No. WO 03/062490 published Jul. 31, 2003, which is commonly assigned to Sundew Technologies, Inc., embodiments that helped solve some of the problems described above were disclosed. Systems, apparatuses, and methods in accordance with that invention provide Synchronous Modulation of Flow and Draw ("SMFD") in chemical processes, and in particular, in atomic layer deposition processes and systems. These patent applications are included here as references.

Atomic layer deposition ("ALD") is preferably practiced with the highest possible flow rate through the deposition chamber during purge, and with the lowest possible flow rate during dosage of chemicals. Accordingly, an efficient ALD system in accordance with U.S. patent application Ser. No. 10/347575, now U.S. Pat. No. 6,911,092 issued Jun. 28, 2005, which is commonly assigned to Sundew Technologies, Inc., and PCT Application No. US03/01548, now PCT Publication No. WO 03/062490 published Jul. 31, 2003, which is commonly assigned to Sundew Technologies, Inc., is able to generate and accommodate significant modulation of flow rates. Under steady-state conditions, the flow of process gas (either inert purge gas or chemical reactant gas) into a chamber, referred to herein as "flow", substantially matches the flow of gas out of a chamber, referred to herein as "draw".

An important aspect of an embodiment in accordance with the invention described in U.S. patent application Ser. No. 10/347575, now U.S. Pat. No. 6,911,092 issued Jun. 28, 2005, which is commonly assigned to Sundew Technologies, Inc., and PCT Application No. US03/0 1548, now PCT Publication No. WO 03/062490 published Jul. 31, 2003, which is commonly assigned to Sundew Technologies, Inc., is that it resolves the trade-off in conventional ALD systems between the contradictory requirements of a high flow rate during a purge of the deposition chamber and of a low flow rate during chemical dosage. SMFD in accordance with that invention provides the ability to purge a process chamber at a low-pressure and a high purge-gas flow rate, and sequentially to conduct chemical dosage in the process chamber at a high-pressure and a low flow rate of chemical reactant gas, and to modulate pressures and gas flow rates with fast response times.

While the SMFD-ALD device disclosed in the prior applications of this inventor is a significant improvement in the deposition art, in some respects the design still reflects the technology available in conventional deposition processes it would be highly useful to have an improved process chamber that takes better advantage of the SMFD process, and more fully develops chemical utilization efficiencies. It also would be useful to provide SMFD-ALD chemical source designs better adapted to the SMFD process, especially for the efficient and consistent delivery of vapor from low-volatility liquid and solid chemicals.

SUMMARY OF THE INVENTION

Embodiments in accordance with the invention provide improved apparatus and method to further enhance the advantages of SMFD-ALD apparatus and method. In one embodiment, the invention provides a method of conducting atomic layer deposition with enhanced material utilization efficiency. In that method, chemical dosage is conducted in a dose and hold mode. During the hold mode, the flow of chemical into the process chamber is terminated while the flux is effectively maintained. This mode is beneficial for the final stages of chemical dose where chemical depletion is minimal, while maintaining chemical flux can further promote the reaction far into saturation to much improve film quality.

In one aspect a method in accordance with the invention comprises conducting a chemical dose stage. The chemical dose stage includes firstly flowing a chemical reactant gas to substantially fill up a deposition chamber, secondly the stage includes substantially reducing the flow of the chemical reactant gas while concurrently reducing the flow out of the deposition chamber by increasing the pressure downstream to the deposition chamber to substantially match the flow out of the deposition chamber to the chemical reactant gas flow into the deposition chamber. Thirdly, terminating the flow of the chemical into the deposition chamber while concurrently substantially matching the pressure downstream from the deposition chamber to the pressure in the deposition chamber to substantially suppress the flow out of the deposition chamber and continuing the chemical dose stage for a specified time without further introduction of chemical flow. This mode of conducting chemical dose during SMFD-ALD process is in-particular advantageous when the pressure downstream to the deposition chamber is preferably increased by flowing gas into a draw gas introduction chamber (DGIC) located in serial fluidic communication downstream from the deposition chamber.

Improved ALD performance is also described in terms of apparatus and method to apply a seal-protected slot valve to control the flow restriction properties of the ALD space. According to the invention an ALD system comprises an improved perimeter slot valve (PSV) in a reactor vessel includes a substrate-transport slot through the reactor-vessel wall (852), a continuous perimeter cavity (854) within the reactor-vessel wall, a continuous sealing poppet (856') and an actuator (858) for moving the sealing poppet between an open position and a closed position. The sealing poppet is moved into the perimeter cavity in the closed position, and out of the perimeter cavity in the open position. The substrate-transport slot is substantially coplanar with a substrate-supporting surface of the substrate holder and the perimeter cavity is substantially coplanar with the substrate-transport slot. The substrate-transport slot defines a substrate-transport channel through the reactor-vessel wall to the substrate holder when the sealing poppet is in the open position and separates the substrate-transport slot from the vessel interior when the sealing poppet is in the closed position. The improved seal-protected PSV comprises a fixed upper sealing surface, an upper poppet sealing surface corresponding to the fixed upper sealing surface, an upper peripheral seal, a fixed lower sealing surface, a lower poppet sealing surface corresponding to the fixed lower sealing surface and a lower peripheral seal. According to an important aspect of the invention the upper sealing surfaces, the lower sealing surfaces, and the peripheral seals are configured to seal the vessel interior when the sealing poppet is in the closed position. In this embodiment, the substrate holder is larger than the substrate and the perimeter area of the substrate holder is not covered by the substrate, as a result the sealing poppet creates a substantially peripheral narrow gap between the uncovered perimeter area of the substrate holder and the bottom surface of the poppet when the seal-protected-PSV is in the closed position where the peripheral narrow gap is narrower than the substrate transport slot when the PSV is in the closed position but the radial narrow gap is wider than the substrate transport slot when the PSV is in the open position. In many implementations of the invention, the gap controlling PSV is preferably radially shaped. Most importantly is that the implementation of SMFD-ALD apparatus design with a DGIC and the SMFD-ALD method enables seal-protected PSV implementation that is suitable and low-maintenance. In a preferred design in accordance with the invention, the bottom surface of the poppet is preferably designed with a substantially down-looking convex shape. Additional improvement taught by the invention utilizes a purge gas that is preferably introduced at substantially low flow between the fixed upper sealing surface and the upper poppet sealing surface to protect the upper sealing surface. In yet another improvement a PSV also includes a peripheral inflatable seal that is preferably formed between the fixed upper sealing surface and the upper poppet sealing surface and the seal is preferably inflated when the PSV is closed to substantially fill-up the downstream from the upper peripheral seal between the fixed upper sealing surface and the upper poppet sealing surface when said inflatable seal is inflated. In another improvement the inflatable seal is preferably made from a slightly permeable elastomer and the inflatable seal is inflated with high purity inert gas to provide localized purge gas at the area of the inflated seal that is located between the fixed upper sealing surface and the upper poppet sealing surface and is exposed to the process. This localized purge substantially protects the exposed area of the seal from directly contacting the process chemicals. Alternatively the inflatable seal is preferably made from a perforated elastomer and the inflatable seal is inflated with high purity inert gas to provide localized purge gas at the area of the inflated seal that is located between the fixed upper sealing surface and the upper poppet sealing surface and is exposed to the process. This localized purge substantially protects the exposed area of the seal from directly contacting the process chemicals.

The invention further teaches and clearly illustrates in the preferred embodiment description and drawings that the bottom surface of the poppet is advantageously designed with a substantially down-looking convex shape to minimize flow disturbances.

Enhanced maintainability of gap-controlling PSV according to another embodiment presented in this invention introduces a purge gas at substantially low flow between the fixed upper sealing surface and the upper poppet sealing surface of the PSV. This purge gas is supplied during processing and protects the inevitable crevice between the poppet and the associated sealing surface from chemical entrapment and the growth of inferior film.

Enhanced maintainability of gap-controlling PSV according to yet another embodiment presented in this invention utilizes a radial inflatable seal formed between the fixed upper sealing surface and the upper poppet sealing surface of the gap-controlling PSV. According to this embodiment, the inflatable seal is placed in the gap between the poppet and the corresponding sealing surface, downstream from the upper peripheral radial seal. The seal is preferably inflated when the PSV is closed to substantially close and eliminate the gap downstream from the upper peripheral seal between the fixed upper sealing surface and the upper poppet sealing surface. In a further enhancement, the inflatable seal is preferably made from a slightly permeable polymer, and the inflatable seal is preferably inflated with high purity inert gas. The minimal area of the inflated seal that is preferably located between the fixed upper sealing surface and the upper poppet sealing surface and preferably is exposed to the process and is therefore substantially purged by the flow of the high purity inert gas out of the inflated seal. That flow can be maintained very low to effectively have no distinguishable impact on SMFD-ALD performance. In another variation in accordance with the teaching of this invention, the inflatable seal is preferably made from a perforated polymer and the inflatable seal is preferably inflated with high purity inert gas. The minimal area of the inflated seal that is located between the fixed upper sealing surface and the upper poppet sealing surface and is exposed to the process is substantially purged by the flow of said inert gas out of the inflated seal.

The invention also discloses a semi-PSV (SPSV) apparatus for enhancing SMFD-ALD performance. Accordingly, the SPSV includes a substrate-transport slot through the reactor-vessel wall, a continuous perimeter cavity within the reactor-vessel wall, a continuous sealing poppet, and an actuator for moving the sealing poppet between an open position and a closed position. The sealing poppet is moved into the perimeter cavity in the closed position and out of the perimeter cavity in the open position. The substrate-transport slot is preferably substantially coplanar with a substrate-supporting surface of the substrate holder, and the perimeter cavity is preferably substantially coplanar with the substrate-transport slot. The substrate-transport slot preferably defines a substrate-transport channel through the reactor-vessel wall to the substrate holder when the sealing poppet is in the open position. The sealing poppet preferably separates the substrate-transport slot from the vessel interior when the sealing poppet is in the closed position. Specifically, the SPSV further includes a chamber top, a flexible metal bellow seal or a sliding vacuum seal allowing the chamber top to move up and down while maintaining vacuum integrity, a fixed lower sealing surface, a lower poppet sealing surface corresponding to the fixed lower sealing surface, and a lower peripheral seal. The lower sealing surface and the peripheral seal are configured to seal the vessel interior when the sealing poppet is in the closed position. At that position, the poppet essentially defines the top portion of the vessel. In some SPSV designs the substrate holder is preferably larger than the substrate, and the perimeter area of the substrate holder is not covered by the substrate. The sealing poppet preferably creates a substantially peripheral narrow gap between the uncovered perimeter area of the substrate holder and the bottom surface of the poppet. This peripheral gap is preferably narrower than the substrate transport slot when the SPSV is in the closed position and is preferably equal or wider than the substrate transport slot when the SPSV is in the open position. In important aspects of the invention the chamber top can preferably include a gas distribution showerhead. The design advantageously enhances SMFD-ALD by providing reduced conductance from the process chamber into the draw chamber or the DGIC. In one advantageous embodiment, the entire ALD manifold is preferably mounted on the moving top of the SPSV and is preferably connected to the process gas and chemical sources with flexible means. In some applications the SPSV preferably has radial symmetry.

In one aspect of the invention an ALD system comprises a perimeter slot valve (PSV) in a reactor vessel including a substrate-transport slot through the reactor-vessel wall, a continuous perimeter cavity within the reactor-vessel wall, a continuous sealing poppet and an actuator for moving the sealing poppet between an open position and a closed position wherein the sealing poppet is moved into the perimeter cavity in the closed position and out of the perimeter cavity in the open position. The substrate-transport slot is substantially coplanar with a substrate-supporting surface of the substrate holder, the perimeter cavity is substantially coplanar with the substrate-transport slot, the substrate-transport slot defines a substrate-transport channel through the reactor-vessel wall to the substrate holder when the sealing poppet is in the open position and separates the substrate-transport slot from the vessel interior when the sealing poppet is in the closed position. The PSV further includes a fixed upper sealing surface, an upper poppet sealing surface corresponding to the fixed upper sealing surface, an upper peripheral seal, a fixed lower sealing surface, a lower poppet sealing surface corresponding to the fixed lower sealing surface and a lower peripheral seal. The upper sealing surfaces, the lower sealing surfaces and the peripheral seals are configured to seal the vessel interior when the sealing poppet is in the closed position. Additionally, a plenum for delivering inert gas into the vessel interior wherein the poppet, the substrate holder and the inert gas delivery plenum are configured to define a peripheral space when the PSV is in the closed position and the inert gas is inserted through the inert gas delivery plenum during chemical dose to substantially reduce the flux of the chemical at the surface of the upper seal and the lower seal. This seal-protected PSV apparatus and method are preferably suitable for PSV with radial symmetry as well as any other symmetry.

In another aspect an SMFD-ALD system is disclosed comprising a reaction vessel defined by reaction vessel wall, a translatable liner and an actuator to translate the translatable liner between low and high positions. This translatable liner preferably includes a substantially convex surface at the bottom portion that creates a peripheral gap when actuated to the low position creating a substantially symmetric peripheral surface around a substrate holder. The substrate holder is preferably larger than the substrate and a peripheral DGIC space is preferably created between the liner, the substrate holder and the wall of the reaction vessel when the liner is at the low position. In further aspect the liner preferably comprises a gas plenum to deliver inert gas from the upper and the lower peripheral edges of the liner into the peripheral DGIC space and the inert gas is preferably inserted through this gas plenum during chemical dose to substantially reduce the flux of the chemical at the surface of the upper edge and the lower edge of the liner and their respective crevices. The Apparatus disclosed with respect to the translatable liner can be preferably selected to have radial symmetry or other peripheral symmetry.

In yet another improvement this invention discloses an SMFD-ALD system comprising an apparatus for high speed draw control gas delivery into and out-of a DGIC. In a specific aspect the SMFD-ALD system having high-speed draw control gas delivery apparatus comprises an inlet FRE, a gas reservoir, A shutoff valve, an outlet FRE all placed in series fluidic communication between an inert gas source and the DGIC. Additionally, a pumping line and a pumping shutoff valve provide serial fluidic communication between the outlet FRE and a vacuum pump. The apparatus is set to shape a time varying inert gas introduction into a parasitic space that is located in serial fluidic communication between the outlet FRE and the DGIC and the time varying inert gas introduction preferably comprises a high-flow leading edge. To facilitate fast reduction of draw-control flow the parasitic space is preferably connected to the vacuum pump concurrently with the shut-off of the inlet valve.

In another aspect an atomic layer deposition system comprising a deposition chamber, a gas draw chamber, a deposition chamber seal having a seal gap area exposed to the deposition and a gas purge source connected to the seal gap is disclosed.

In another aspect a method of atomic layer deposition comprises providing an atomic layer depositing apparatus having a deposition chamber and a deposition chamber seal gap, a portion of which seal gap is exposed to the deposition chamber wherein the method includes depositing a thin film in the deposition chamber and purging the seal gap portion exposed to the deposition chamber with purge gas during the deposition is key to maintain the seal and the performance of the ALD system.

In another aspect a disclosed atomic layer deposition apparatus comprises a combination of a deposition chamber housing having a fixed housing portion and a movable portion and the movable portion is supported on a bellows to maintain vacuum integrity.

In another aspect an atomic layer deposition apparatus comprises a deposition chamber housing having a fixed housing portion and a movable portion, a gap between the fixed housing portion and the movable portion and an inflatable seal for sealing that gap. In a modified aspect the seal is preferably perforated and further includes a source of purge gas connected to the gap. In another modification the apparatus preferably includes a shaped seat against which the seal seats when inflated. In another modification the apparatus preferably includes a ferrule located interior to the inflatable seal.

Improvements are also disclosed for SMFD optimized source design. Apparatuses and methods for generic source design are implemented with commercially available pressure controller for volatile chemicals and with the aid of newly invented apparatuses for lower-volatility chemicals. A chemical vapor source for SMFD-ALD apparatus in accordance with the invention includes a chemical container, a pressure controller in serial fluidic communication downstream from the chemical container, and a source chamber in serial fluidic communication downstream from the pressure controller. The pressure controller is located in serial fluidic communication upstream from the source chamber. The set pressure of the chemical vapor is maintained in the source chamber by the pressure controller. In one preferred design, the chemical source capacity preferably exceeds the capacity loss per ALD cycle by a factor of 10. In another exemplary design, the chemical source capacity preferably exceeds the capacity loss per ALD cycle by a factor of 100.

Further, the invention discloses a chemical vapor source for an SMFD-ALD apparatus comprising a liquid delivery system, a vaporizer in serial fluidic communication downstream from that liquid delivery system, and a source chamber in serial fluidic communication downstream from the vaporizer. A set chemical vapor pressure inside the source chamber is maintained by controlling the liquid delivery into the vaporizer. The chemical vapor pressure is measured in the source chamber, and the liquid delivery system is controlled to maintain that pressure at the set point. Therefore, the precision and response of the pressure control depends on the precision of the liquid delivery system and its ability to respond quickly. In one exemplary embodiment, the chemical source capacity preferably exceeds the capacity loss per ALD cycle by a factor of 10. In another exemplary embodiment, the chemical source capacity preferably exceeds the capacity loss per ALD cycle by a factor of 100.

Further, an advantageous embodiment for a liquid delivery apparatus is disclosed, exemplified, and illustrated for clarity. Accordingly, a controlled flow of liquid through preferably a proportional valve, a metering valve or a fixed orifice is driven by an expandable pressure chamber. The expansion of that expandable pressure chamber protrudes into a liquid filled chamber. The pressure chamber is separated from the liquid filled chamber with an expandable flexible metallic bellow. When the pressure chamber is inflated, it expands the bellow into the liquid-filled chamber to effectively pressurize the liquid and trigger the flow. The inflation or deflation operations are controlled with a fast solenoid-based valve and the introduction or disposition of air pressure, respectively. Accordingly, liquid flow can be triggered ON or OFF with unprecedented and adequate speed preferably in the range of from 5 msec to 50 msec response time.

In another aspect of the invention a chemical vapor source for SMFD-ALD apparatus is disclosed comprising a chemical source employing a temperature controlled sensor that senses the accumulation of materials on it's sensing surface to control the vapor pressure of the chemical within a source space. The walls of the source space are preferably maintained at a temperature that is sufficiently high to prevent condensation of the chemical. Preferably, the sensor is a quartz crystal microbalance (QCM) sensor or a SAW device thickness monitor or any other sensor that can sense the accumulation of material on it's sensing surface. Accordingly, the sensor is applied to control the temperature of the chemical to continuously maintain a minimal condensation of the chemical over the sensor. In an aspect of this invented chemical source the chemical is preferably loaded into a heatable holder, such as crucible, and the power to heat the crucible is preferably controlled by the sensor. In most applications taught by the invention the chemical is preferably solid. An important design preferably incorporates chemical delivery into the crucible as a slurry of fine powder and inert liquid preferably liquid with low boiling temperature. The inert liquid preferably does not substantially dissolute the solid chemical and can be vacuum evaporated away from the chemical source to effectively leave a pure and dry solid chemical inside the crucible. In certain application the chemical source taught in this invention preferably employs also a combination of pressure gauge and controllable valve to control the total pressure within the source space that exceeds the vapor pressure controlled from the chemical. In that case the controllable valve preferably delivers inert gas into the source space. A method and apparatus for increasing the versatility of the source is disclosed where the controllable valve preferably delivers an etching gas into the source space and the chemical is preferably generated within the source space. In this aspect controlling the vapor pressure of the chemical preferably means controlling the temperature of an elemental or compound target and/or the temperature of the etchant to induce sufficient etching and the chemical is essentially the product of said etching. This apparatus and method are especially and preferably useful to produce precursors from the elements Hf, Zr, Ru, $RuO_2$, Si, W, Mo, Co, Cu, Al, Fe, Os, $OsO_2$ and Ta; and the etching gas preferably selected from the list of $Cl_2$, $Cl_2/N_2$, $Cl_2/O_2/O_3$, $N_2/HF$, CO, $CO/N_2$ and their combinations. In another apparatus design, temperature limitations of pressure gauges are preferably overcome by implementing the chemical source using a pressure controlled gas reservoir in series fluidic communication upstream from the source space and a shutoff valve placed in series fluidic communication between the pressure controlled reservoir and the source space where the shutoff valve is preferably used to substantially equalize the total pressure within the source space to the pressure in the pressure controlled reservoir between successive ALD doses. In this case there is preferably no need to include a heatable pressure gauge within the hot zone of the source and the source useful temperature range is preferably extended beyond the limitation of pressure gauges. The source that is taught in this invention is preferably very useful and adequate for ALD applications when the capacity of the source space is preferably more than 10 time the capacity required for a single ALD dose and even better suited for ALD when the capacity of the source space is preferably more than 50 time the capacity required for a single ALD dose. In conjunction with the chemical source apparatus that is extensively disclosed and exemplified in this invention a complementary method for substantially controlling the vapor pressure of a chemical within a space employing a temperature controlled sensor to measure the condensation rate of the chemical at the sensor's temperature is disclosed. The sensor is employed to control the evaporation rate of the chemical to maintain a minimal measurable condensation rate while the sensor's temperature is selected to appropriately determine the desired vapor pressure of the chemical. The method is preferably extended to cases that preferably require seeding the chemicals into a carrier gas wherein a total pressure higher than the vapor pressure of the chemical is preferably controlled inside the source space and the balance of gas inside the source space preferably comprises an inert gas. The method is even further extended to cases that preferably require seeding the chemicals into a carrier gas wherein a total pressure higher than the vapor pressure of the chemical is controlled inside the source space and the balance of gas inside the source space preferably comprises an etching gas or an etching gas mixture and the desired chemical is preferably generated by etching an elemental or compound target while the sensor is preferably employed to control the generation rate of the desired chemical to maintain a minimal measurable condensation rate measured on the sensor. The selected generation rate of the desired chemical is preferably controlled by controlling the heating of the target and the sensor's temperature is selected to appropriately determine the desired vapor pressure of the desired chemical.

The invention thus also provides a chemical source vapor pressure control system comprising a deposition chamber, a chemical source holder for holding the chemical source, a chemical source heater, a source heater controller, and a deposition accumulation sensor, the heater controller electrically connected to the deposition accumulation sensor to control the heating of the source; the system characterized by: the temperature controlled deposition accumulation sensor located out of line-of sight with the chemical source; and a sensor temperature control unit for controlling the temperature of the accumulation sensor to a temperature lower than the condensation temperature of the chemical source at the desired vapor pressure. Preferably, the deposition chamber has chamber walls (708) and further comprising a chamber wall temperature control system for maintaining the walls at a temperature that is sufficiently high to prevent condensation of the chemical source. Preferably, the chemical source vapor pressure control system further includes a pressure gauge, a gas control valve, and a pressure controller connected between the gauge and the valve to control the total pressure within the deposition chamber to a pressure higher than the controlled vapor pressure of the chemical source. Preferably, the chemical source vapor pressure control system includes a source of an etch gas connected to the gas control valve, and the sensor senses an etching product. Preferably, the chemical source is selected from the group consisting of Hf, Zr, Ru, $RuO_2$, Si, W, Mo, Co, Cu, Al, Os, $OsO_2$, Fe, Ta and combinations thereof; and the etching gas is selected from the group consisting of of $Cl_2$, $Cl_2/N_2$, $Cl_2/O_2/O_3$, $N_2/HF$, $N_2/ClF_3$, CO, $CO/N_2$ and combinations thereof. Preferably, the chemical source vapor pressure control system further includes a pressure controlled reservoir (780); a shutoff valve (744') in series fluidic communication between the pressure controlled reservoir and the deposition chamber to substantially equalize the pressure between the deposition chamber and the pressure controlled reservoir between successive ALD doses. Preferably the source is applied for ALD and the capacity of the deposition chamber is 20 times or more larger than the capacity required for a single ALD dose.

The invention also provides a method for controlling the vapor pressure of a chemical source within a source space the method comprising: sensing the accumulation of the chemical on a sensing surface; and controlling the temperature of the chemical source depending on the sensed accumulation. Preferably, the temperature of the chemical source is controlled to maintain a minimal measurable condensation rate on the sensing surface. Preferably, the temperature of the sensor is controlled to appropriately determine the desired vapor pressure of the chemical. Preferably, the total pressure in the source space is controlled to be higher than the vapor pressure of the chemical. Preferably, the method includes introducing an etching gas into the source space, and etching an elemental or compound target to produce the chemical.

BRIEF DESCRIPTION OF THE DRAWINGS

A more complete understanding of the invention may be obtained by reference to the drawings, in which:

FIG. 21 depicts schematically a chemical source implementing a QCM for the measurement and control of chemical vapor pressure using an etch target and an independent total pressure control in accordance with the invention; and FIG. 22 depicts schematically a chemical source implementing a QCM for the measurement and control of chemical vapor pressure using an etch target and an independent total pressure replenishing apparatus in accordance with the invention.

DETAILED DESCRIPTION OF THE PREFERRED EMBODIMENT

Figure 1:
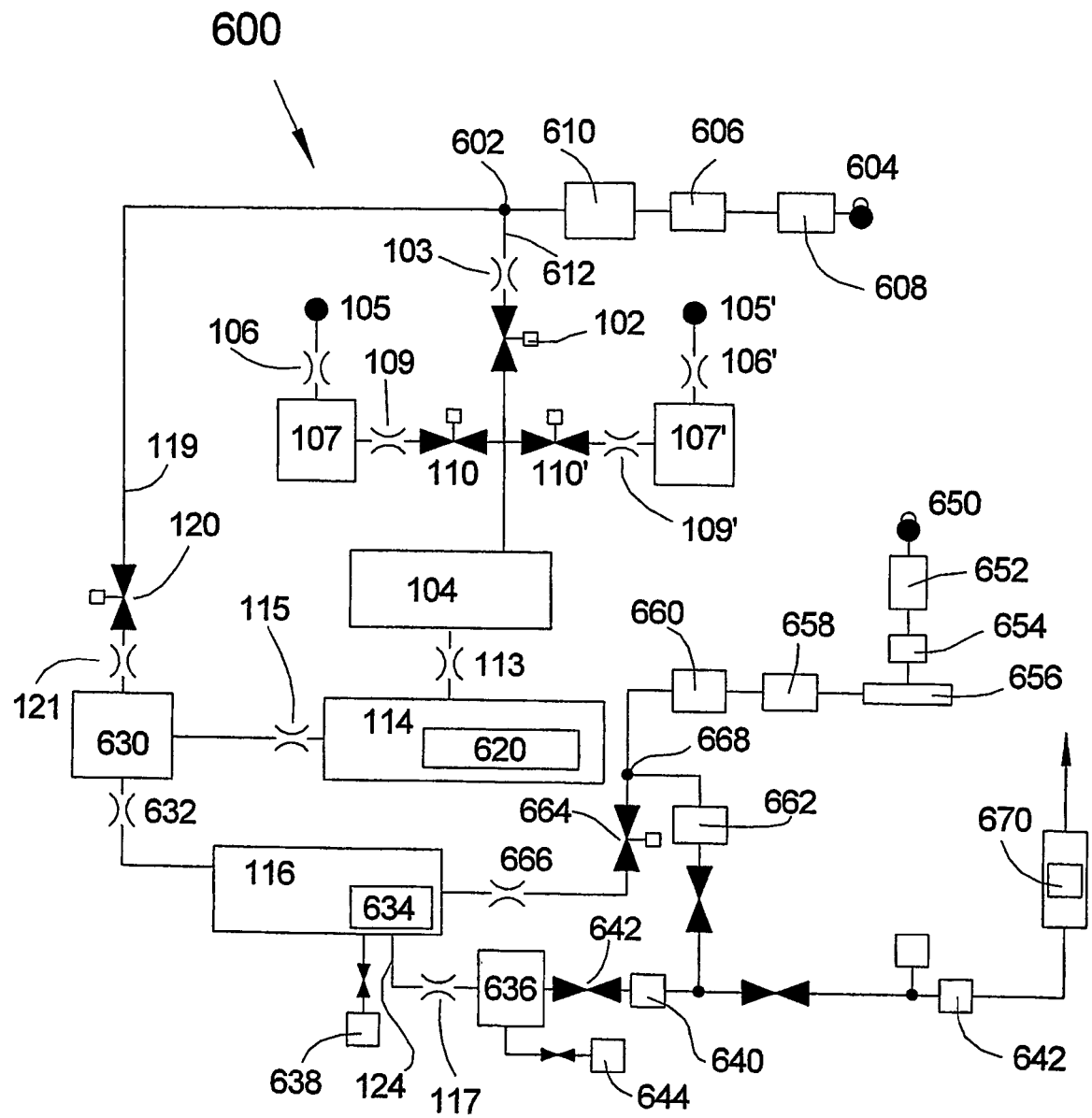
FIG. 1 depicts a flow diagram of a basic embodiment of a synchronously modulated flow-draw ("SMFD") ALD system in accordance with the invention.

The invention is described herein with reference to FIGS. 1-22. For the sake of clarity, the same reference numerals are used in several figures to refer to similar or identical components. It should be understood that the structures and systems depicted in schematic form in FIGS. 1-22 serve explanatory purposes and are not precise depictions of actual structures and systems in accordance with the invention. Furthermore, the embodiments described herein are exemplary and are not intended to limit the scope of the invention, which is defined in the invention summary and in the claims below.

FIG. 1 depicts a flow diagram of a basic embodiment of a synchronously modulated flow-draw ("SMFD") ALD system 600 in accordance with the invention described in U.S. patent application Ser. No. 10/347575, now U.S. Pat. No. 6,911,092 issued Jun. 28, 2005, which is commonly assigned to Sundew Technologies, Inc., POT Application No. US03/01548, now PCT Publication No. WO 03/062490 published Jul. 31, 2003, which is commonly assigned to Sundew Technologies, Inc., and the improvements that are disclosed in this application.

System 600 comprises a pressure-stabilized inert, purge-gas source 602 of a purge gas 604. Purge gas is supplied through purge-source shut-off valve 102 and purge-source flow restriction element ("FRE") 103 into gas distribution chamber 104, which is commonly a conventional shower head. As depicted in FIG. 1, purge-source shut-off valve 102 and purge-source FRE 103 provide serial fluidic communication between purge-gas source 602 and gas distribution chamber 104. In this specification, flow restriction elements (FREs) cause a pressure step-down when gas is flowing through them. A chemical reactant precursor in the form of a pure chemical gas, a vapor from a liquid or solid chemical, or mixtures of vapor or gas chemicals with inert gas is provided at well-controlled pressure at a plurality of chemical-gas sources 105, 105'. Chemical-gas source 105 is connected in serial fluidic communication with booster chamber 107 through chemical-source-FRE 106. Booster chamber 107 is connected in serial fluidic communication with gas distribution chamber (showerhead) 104 through chemical-dosage shut-off valve 110 and booster-FRE 109. As depicted in FIG. 1, second chemical-gas source 105' is connected to showerhead 104 with devices corresponding to those described with reference to chemical-gas source 105.

Gas-distribution FRE 113 provides serial fluidic communication between gas distribution chamber 104 and atomic layer deposition chamber ("deposition chamber") 114. In a preferred embodiment, in which gas distribution chamber 104 is a showerhead device, gas-distribution FRE 113 is commonly a nozzle array. A nozzle array provides restricted and uniform flow from gas distribution chamber 104 to deposition chamber 114, which contains a substrate being treated. A substrate supporting chuck with means to control the substrate temperature, 620, is disposed within deposition chamber 114.

Deposition chamber 114 is connected in serial fluidic communication to a small-volume draw-gas introduction chamber ("DGIC") 630 through deposition-chamber FRE 115. Inert draw-gas source 602 is connected in serial fluidic communication to DGIC 630 through draw-gas line 119, draw-source shut-off valve 120, and draw-source-FRE 121. Draw-gas introduction chamber 630 is connected in serial fluidic communication through DGIC-FRE 632 to draw control chamber ("DC") 116. A chemical abatement element 634 is disposed inside DC 116. DC 116 is connected in serial fluidic communication to pump chamber 636 through draw-control outlet 124 and draw-control FRE 117. A pressure gauge 638 is connected to DC 116. Pressure gauge 638, for example, an MKS Baratron model 628 type, monitors the process through, for example, the average pressure in DC 116. Similarly, other process monitoring devices (not shown), such as gas analyzers, can be conveniently connected to DC 116. Low pressure gauge 644, such as an HPS I-Mag cold-cathode gauge, is attached to pump chamber 636 to monitor chamber pressure during idle time. Turbomolecular pump 640 is connected to pump chamber 636 through a pumping gate-valve 642 to facilitate high vacuum during idle time and high-throughput flow during ALD operation. For example, a pump selected from the BOC-Edwards STPA series is suitable. Good performance for ALD deposition on 200 mm silicon wafers was obtained using an STPA 1303C pump. Turbomolecular pump 640 is evacuated using backing pump 646. For example, a BOC Edwards QDP40 or equivalent serves well as backing pump 646. In other embodiments in accordance with the invention, higher pumping-speed pump arrangements, such as the QMB series from BOC Edwards, facilitate remote location placement of dry pumps, as known in the art.

In certain preferred embodiments, reactive gas is added to DC 116 to enhance chemical abatement. Accordingly, system 600 comprises an ozone-supply manifold. Oxygen, oxygen-argon or oxygen-nitrogen mixtures are supplied from gas cylinder 650. A mass flow controller 652 controls the flow of gas into a commercially available ozone generator 654. For example, the MKS Astex AX8407 series ozone generators perform well in SMFD system 600. The output from ozone generator 654 is monitored by ozone monitor 656, allowing feedback-control stabilization of ozone concentrations. Pressure controller 658, for example, an MKS 640A type, maintains a selected constant pressure inside ozone generator 654. For the purpose of pulsing ozone into DC 116 while maintaining controlled flow and pressure that are necessary for correct operation of ozone generator 654, an ozone reservoir 660 comprises a volume selected to suppress the impact of ozone pulsing on the pressure inside ozone generator 654. This allows pulsing of reactive ozone into DC 116, while maintaining a desired flow and pressure in ozone generator 654. Pressure controller 662 controls the pressure in ozone reservoir 660. Ozone degradation is minimized in system manifold 600 by maintaining the ozone supply manifold at substantially room temperature and by minimizing the stagnant volume between ozone generator 654 and DC 116. For example, the stagnant volume is described schematically in FIG. 1 by the dead-leg between valve 664 and junction 668. Ozone is fed to ozone shut-off valve 664 and ozone-source FRE 666 through the inner tubing of a double-wall line and fed to the inlet of pressure controller 662 by the return flow between the inner and the outer tubing. In this manner, the impact of ozone depletion in the stagnant space is minimized by reducing the dead-leg between valve 664 and junction 668 to less than 1 cc. Preferably, an ozone-eliminating catalytic converter 670 is disposed at the outlet of pump 642 to suppress ozone emission to the ambient.

In a preferred embodiment, the functionality of chemical-dosage shut-off valves 110, 110' was integrated into a multiple-port chemical introduction valve manifold comprising both 110 and 110'. Fast pneumatic valves with millisecond response time, described in a separate patent by the inventor of this invention were mainly utilized successfully for that purpose.

During typical ALD operation, apparatus 600 is switched essentially between two static modes, a purge mode ("purge") and a chemical-dosage mode ("dose"). Representative valve-settings of the two basic modes of operation are presented in Table 1. More teaching about the SMFD ALD apparatus and method is given in U.S. patent application Ser No. 10/347575, now U.S. Pat. No. 6,911,092 issued Jun. 28, 2005, which is commonly assigned to Sundew Technologies, Inc., and PCT Application No. US03/01548, now PCT Publication No. WO 03/062490 published Jul. 31, 2003, which is commonly assigned to Sundew Technologies, Inc.

TABLE 1

| Mode | Valve 102 | Valve 120 | Valve 110 |
| --- | --- | --- | --- |
| Purge | OPEN | CLOSED | CLOSED |
| Chemical dosage | CLOSED | OPEN | OPEN |

Figure 2C:
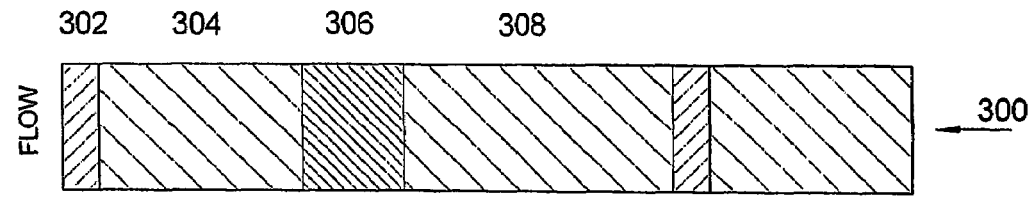
FIG. 2 depicts in schematic form a comparison between prior art ALD process (2a), SMFD-ALD process (2b and 2c), and pulse and hold SMFD-ALD process (2d)
Figure 2C:
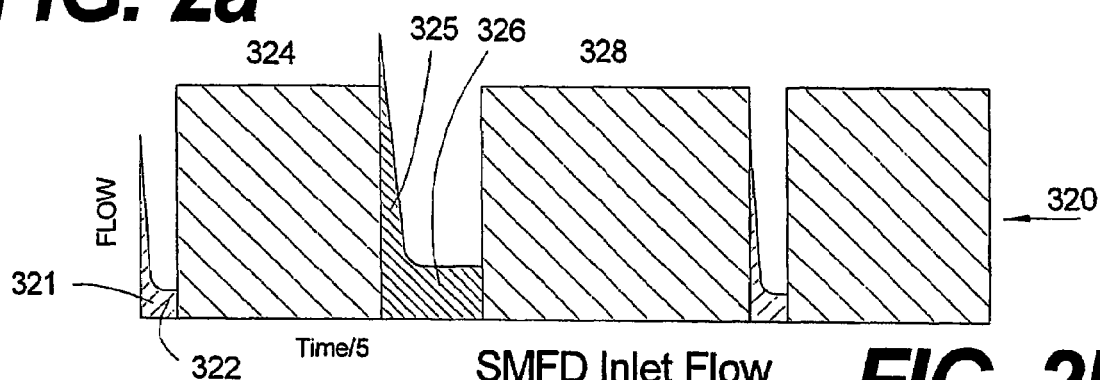

FIGS. 2 present a schematic comparison between prior art flow versus time chart 300 presented in FIG. 2a and the inlet flow into an SMFD showerhead 104, chart 320 presented in FIG. 2b. Since typical SMFD timing is more than 5 times shorter, the time scale of the SMFD charts is divided by a factor of 5. FIG. 2c presents chart 340 which represents the complementary flow versus time into the DGIC 630 in synchronization with the inlet flow depicted in chart 320 (FIG. 2b). An ALD cycle comprised of first chemical dose 302, first purge 304, second chemical dose 306, and second purge 308 is conventionally carried under substantially constant flow conditions as illustrated in chart 300. In contrast, the inlet sequence 320 of first chemical dose 322, first purge 324, second chemical dose 326, and second purge 328 is carried under substantially modulated flow conditions. Complementary draw flow presented in chart 340 maintains the pressure during chemical dose steps with draw flow 342 and 344 during chemical dose steps 322 and 326, respectively. Note the transient stages 321 and 325 at the leading edge of chemical dose 322 and 326, respectively. These booster high-flow leading edge transients are further taught in U.S. patent application Ser. No. 10/347575, now U.S. Pat. No. 6,911,092 issued Jun. 28, 2005, which is commonly assigned to Sundew Technologies, Inc., and PCT Application No. US03/101548, now PCT Publication No. WO 03/062490 published Jul. 31, 2003, which is commonly assigned to Sundew Technologies, Inc.

A further improvement in chemical utilization splits the chemical dose steps into pulse and hold in accordance with Table 2.

TABLE 2

| Mode | Valve 102 | Valve 120 | Valve 110 |
| --- | --- | --- | --- |
| Purge | OPEN | CLOSED | CLOSED |
| Chemical dose PULSE | CLOSED | OPEN | OPEN |
| Chemical dose HOLD | CLOSED | OPEN | CLOSED |

Figure 2D:
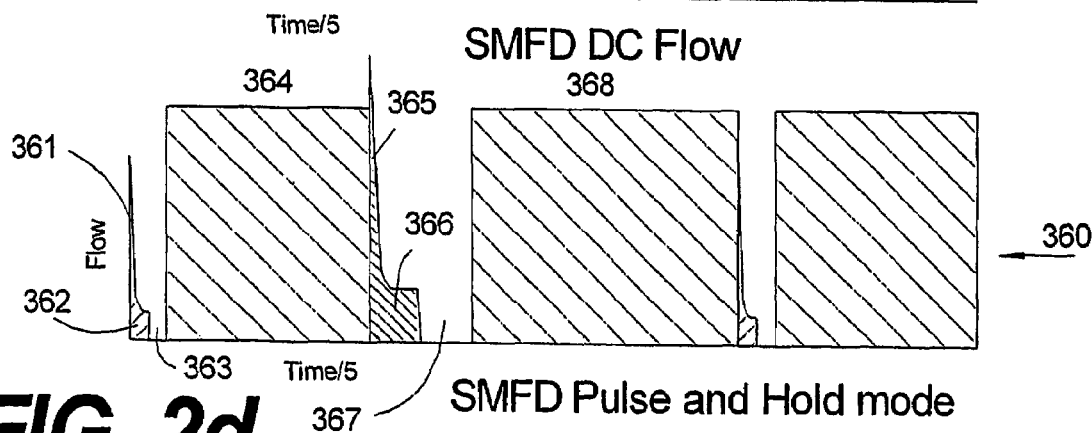

This improvement is depicted in FIG. 2d. The flow versus time is illustrated in chart 360. Accordingly, the first chemical dose includes transient 361, low flow steady-state 362, and no flow period 363. Similarly, the second chemical dose includes transient 365, low flow steady-state 366, and no flow 367. When valve 110 shuts off during the dose, the flow into the deposition chamber ceases. The deposition chamber becomes a dead-leg and the pressure in deposition chamber 114 transients down slightly to match the pressure in DGIC 630. If chemical depletion is not prominent, dose time is extended at no additional increase in chemical utilization. This improved mode of chemical dose can be utilized to improve the quality of ALD films by extending chemical reaction time to facilitate further completion of these reactions. The global rate of the typically first order ALD reactions is proportional to the flux of chemicals and concentration of unreacted sites. Naturally, as the reaction propagates, the number of reactive sites decreases and accordingly the global reaction rate decreases. In many ALD processes, the inevitable residual concentration of reactive sites that is not reacted at the end of the chemical dose step contributes to the inclusion of impurities in the film. In particular, embedded OH groups are detrimental to insulating properties of dielectric ALD films. Therefore, in some ALD processes, film quality may require extended chemical dose exposures. The pulse and hold mode given in Table 2 and illustrated in chart 360 advantageously extends the actual dose exposure while avoiding the penalty of increasing chemical utilization. For example, trimethylaluminum (TMA) dose of 50 msec was utilized with only 10 msec to 20 msec of pulse and complementary 30 msec to 40 msec of hold on our SMFD system. The pulse and hold mode further improves chemical utilization efficiencies by eliminating any pressure gradients in deposition chamber 114 during the HOLD time. This decoupling between the exposure (flux multiplied by dose time) and the utilization of chemical is a key advantage of pulse-and-hold SMFD.

The pulse-and-hold mode enables efficient chemical utilization during low temperature ALD. ALD reactions are thermally activated. At low temperatures, ALD reactions are slow and inefficient. To minimize dose times, ALD precursors are dosed at maximized pressure and 100% concentration. Pulse and hold SMFD mode is advantageously implemented to suppress the loss of chemical during dose. A pulse and hold sequence was implemented for TMA dose during SMFD-ALD of $Al_2O_3$ at 100° C. A fully saturated process step required only 20 msec of pulse and 30 msec of dose (total of 50 msec dose time). Material utilization was greater than 5%, which is extremely good for such low temperature process that was executed with such short dose time.

A useful range for dose was attempted successfully between 5 msec to 120 msec, and a useful range of hold was tested from a minimum of 5 msec up to 200 msec. Preferably, dose is carried with a 5 msec to 50 msec duration, and hold is carried with a 20 msec to 100 msec duration. Mostly a preferred range of 5 msec to 25 msec for dose and 15 msec to 35 msec for hold is recommended.

Figure 3:
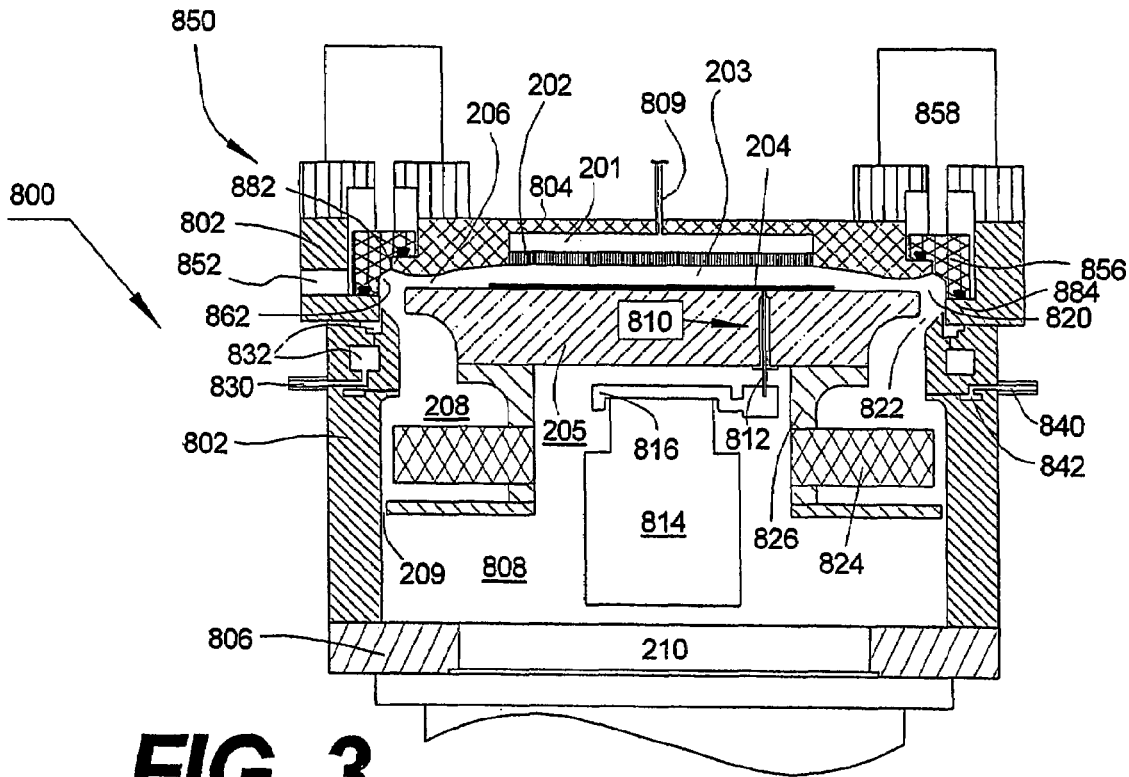
FIG. 3 depicts schematically a seal-protected perimeter slot valve at the close position in accordance with the invention.
Figure 4:
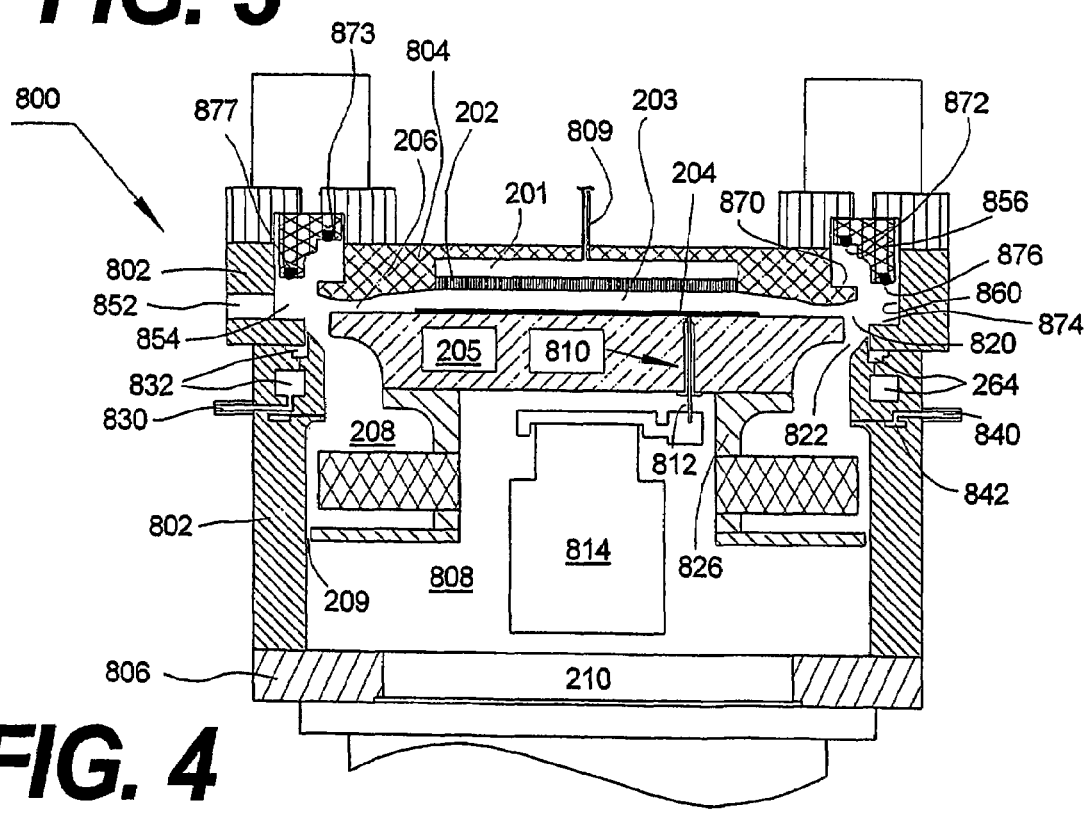
FIG. 4 depicts schematically a seal protected perimeter slot valve at the open position in accordance with the invention.

FIGS. 3 and 4 depict in schematic form a cross-section of a preferred ALD reactor vessel 800. As shown in FIG. 3, reactor vessel 800 comprises a reactor-vessel wall 802, a reactor-vessel top 804, and a vessel-bottom 806, which define a vessel interior 808. Reactor vessel 800 includes gas distribution chamber (showerhead) 201. A showerhead inlet 809 at top 804 serves as an inlet for chemical reactant gases and purge gases into showerhead 201. Nozzle array flow restricting element (FRE) 202 separates the bottom of gas distribution chamber 201 from ALD deposition chamber (process chamber) 203. A substrate 204 is supported on heated wafer chuck (substrate holder) 205, made from a thermally conducting metal (e.g., W, Mo, Al, Ni) or other materials commonly used in the art for hot susceptors and chucks. Wafer chuck 205 includes a wafer lift-pin mechanism 810. Wafer transport is accomplished with aid of lift pins 812 (only one out of three pins shown), as known in the art. Wafer lift pins 812 are actuated to lift wafer substrate 204 above the top surface of chuck 205 using actuator 814 and levitation arm 816. Deposition chamber 203 is confined by deposition-chamber FRE 206 representing a typically peripheral passage between top 804 and chuck 805. A draw-gas introduction chamber ("DGIC") 820 is located downstream from deposition chamber 203, between FRE 206 and DGIC-FRE 822. A draw control chamber ("DC") 208 is located downstream from DGIC, and is confined by DGIC-FRE 822 and draw-control FRE baffle 209. Chemical-abatement element 824 is disposed inside DC 208. Spacer 826 provides direct thermal contact of chemical-abatement element 824 and draw-control FRE baffle 209 with heated wafer chuck 205.

Draw-gas inlet 830 provides serial fluidic communication between a draw-gas manifold (not shown) and a draw gas plenum 832. One skilled in the art can implement draw gas plenum 832 in many different configurations, and the embodiment shown in FIGS. 3 and 4 is a non-exclusive example. As depicted in FIG. 3, draw-gas inlet 830 is in fluidic communication with radial plenum space 832, which further communicates with DGIC 820 through a radial array of nozzles (not shown), which are appropriately spaced and designed to unify the radial flow distribution of gas into DGIC 820 and direct draw gas into the upstream portion of DGIC 820. Those who are skilled in the art can appreciate the necessity to adequately unify the flow of draw gas and reactive abatement gas to conform to the symmetry of the deposition system. For example, the radial symmetry of the system is depicted in FIGS 3 and 4. Indeed, a draw control gas, introduced with a substantially non-uniform radial distribution, impacted the radial distribution of dosed chemicals as observed when ALD was tested with one of the dose steps kept under saturation conditions. While saturation properties of ALD reaction steps can overcome this effect, longer chemical doses are dictated that, in turn, extend the ALD cycle time and in many cases reducing the chemical utilization efficiency. As explained in U.S. patent application Ser. No. 10/347575. now U.S. Pat. No. 6,911,092 issued Jun. 28, 2005, which is commonly assigned to Sundew Technologies; Inc., and PCT Application No. US03/01548, now PCT Publication No. WO 03/062490 published Jul. 31, 2003, which is commonly assigned to Sundew Technologies. Inc., and further below, the draw control gas, the DGIO and the SMFD method are crucial and instrumental in enabling the implementation of perimeter slit-valve to improve performance and reduce the size of the ALD chamber. In that respect, the plenum and the DGIC protect the seals of the PSV and their respective crevices from a substantially damaging contact with the process chemicals.

Optionally, reactive gas is delivered from a reactive gas manifold (not shown) through line 840 into reactive-gas plenum 842. Reactive-gas plenum 842 serves to shape a uniform radial flow distribution of reactive abatement gas into draw chamber 208. For example, the reactive gas is delivered into a radial channel that communicates with draw chamber 208 through a plurality of horizontal nozzles that are appropriately spaced and designed. One skilled in the art can appreciate that reactive gas plenum system 842 can be implemented in many different configurations in accordance with the invention.

During ALD processing, purge gas during a purge stage and chemical reactant gas during a dosage stage flow along a process-gas flow-path through reactor-vessel interior 808 in a downstream direction from showerhead inlet 809 through showerhead 201, deposition chamber 203, DGIC 820, and DC 208, in that order, and out of reactor vessel 800 through vacuum port 210. Similarly, draw gas introduced into DGIC 820 flows in a downstream direction from DGIC 820 into DC 208 and then exits through vacuum port 210. The terms "downstream" and "upstream" are used herein in their usual sense. It is a feature of embodiments in accordance with the invention that backflow of gases, that is, the flow of gases in an "upstream" direction, never occurs, as taught in U.S. patent application Ser. No. 10/347575, now U.S. Pat. No. 6,911,092 issued Jun. 28, 2005, which is commonly assigned to Sundew Technologies, Inc., and PCT Application No. US03/01548 now PCT Publication No. WO 03/062490 published Jul. 31, 2003, which is commonly assigned to Sundew Technologies, Inc. The term "upstream" is used in this specification, however, to designate the relative locations of components and parts of a system.

Reactor vessel 800 further includes a perimeter slot valve ("PSV") 850. As depicted in FIGS. 3 and 4, PSV 850 comprises a substrate-transport slot 852 through reactor-vessel wall 802, a continuous perimeter cavity 854 (FIG. 4) within reactor-vessel wall 802, a continuous sealing poppet 856, and an actuator 858 for moving sealing poppet 856 between an open position (FIG. 4) and a closed position (FIG. 3). Sealing poppet 856 is moved into perimeter cavity 854 in the closed position (FIG. 3), and sealing poppet 856 is moved out of perimeter cavity 854 in the open position (FIG. 4). Substrate-transport slot 852 is substantially coplanar with the substrate-supporting surface of substrate holder 205. Perimeter cavity 854 is substantially coplanar with substrate-transport slot 852. Substrate-transport slot 852 defines a substrate-transport channel through reactor-vessel wall 802 to substrate holder 205 when sealing poppet 856 is in open position (FIG. 4), and sealing poppet 856 separates substrate-transport slot 852 from vessel interior 808 when sealing poppet 856 is in its closed position (FIG. 3).

Reactor-vessel wall 802 defines a vessel perimeter within the reactor-vessel wall, and sealing poppet 856 conforms to the vessel perimeter when sealing poppet 856 is in its closed position (FIG. 3). As depicted in FIGS. 3 and 4, reactor-vessel wall 802 comprises a substantially radially symmetric shape, and sealing poppet 856 comprises a substantially radially symmetric shape in the case wherein the chamber symmetry is substantially radial. It is understood that other embodiments of reactor vessel 800 and PSV 850 in accordance with the invention could have other geometric shapes. As depicted in FIG. 3, sealing poppet 856 in its closed position forms an inner sealing wall 862 of the process-gas flow-path in vessel interior 808. Inner sealing wall 862 comprises a radially symmetrical shape, which promotes a radially symmetric flow of gasses along the process-gas flow-path and, thereby, enhances uniform deposition and reduces formation of solid deposits. In the particular embodiment of reactor vessel 800 as depicted in FIG. 3, a portion of inner sealing wall 862 defines a portion of DGIC 820. As depicted in FIG. 4, PSV 850 comprises a fixed upper sealing surface 870, an upper poppet sealing surface 872 corresponding to fixed upper sealing surface 870, an upper peripheral seal 873, a fixed lower sealing surface 874, a lower poppet sealing surface 876 corresponding to fixed lower sealing surface 874, and a lower peripheral seal 877. Upper sealing surfaces 870, 872, lower sealing surfaces 874, 876, and peripheral seals 873, 877 are configured to seal the vessel interior when sealing poppet 856 is in its closed position (FIG. 3).

As depicted in FIG. 4, upper peripheral seal 873 and lower peripheral seal 877 are assembled on poppet sealing surfaces 872, 876, respectively. Also, seals 873, 877 are configured as o-ring seals. It is clear that different types of seals, for example, flat gasket seals, are useful, and that seals 873, 877 can be assembled on fixed sealing surfaces 870, 874, instead of on poppet sealing surfaces 872, 876. Suitable materials for seals 873, 877 include elastomer materials made from Viton, Kalrez, Chemraz, or equivalents. One skilled in the art is capable of implementing perimeter slot valve 850 in many different configurations.

Substrate-transport slot 852 and the associated wafer transport system communicated through slot 852 are completely isolated from the ALD process system in reactor vessel interior 808 when PSV 850 is closed.

The implementation of the preferred embodiment has revealed that indeed the high flow of inert gas into the leading edge of the DFIC during chemical dose was sufficient to provide exceptional protection against possible film buildup in radial crevices 882 and 884 that are formed between 804 and 856 and between 856 and 802, respectively. Accordingly, seal-protected PSV was implemented with no adverse impact on maintenance cycle or performance. These adverse effects are typical and practical limitations in the case of a simple ring-shaped slit-valve implementation as taught in U.S. Pat. No. 6,347,919. Additional improvements that enable the implementation of perimeter slit-valve in ALD apparatuses and other processing chamber are taught in an additional patent by the inventor of this invention.

Figure 5:
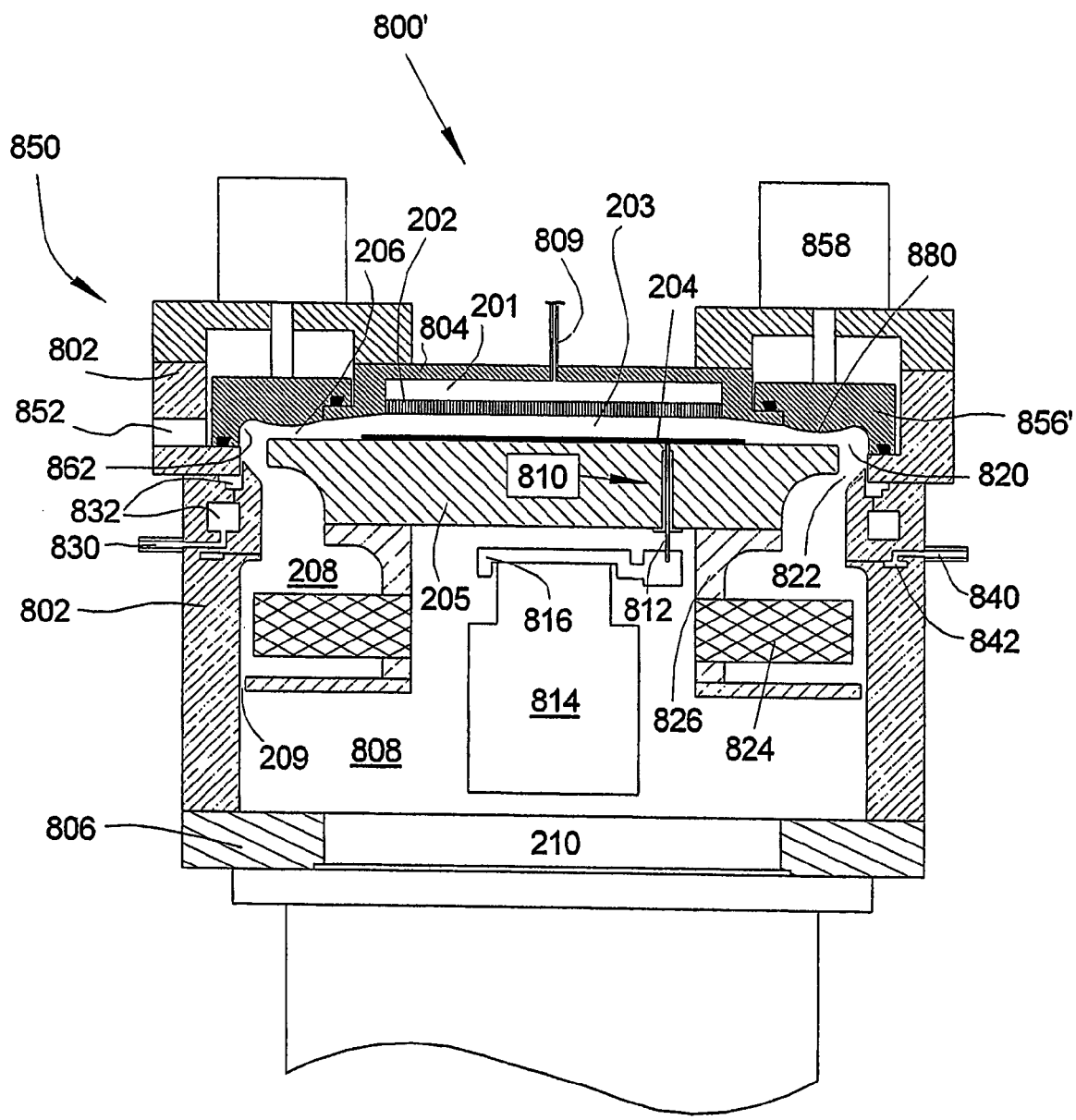
FIG. 5 depicts schematically a gap-controlling perimeter slot valve at the close position in accordance with the invention.
Figure 6:
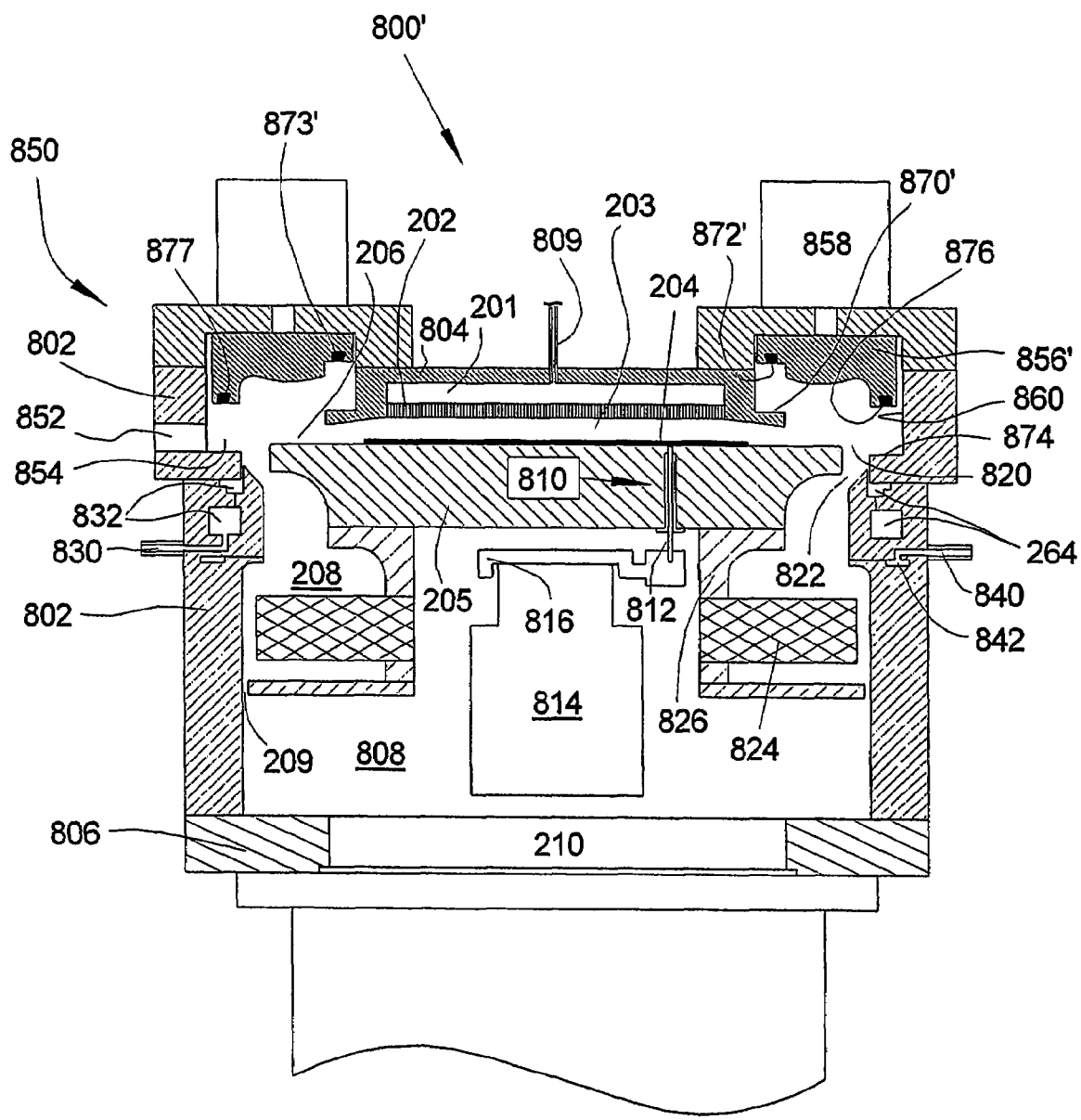
FIG. 6 depicts schematically a gap-controlling perimeter slot valve at the open position in accordance with the invention.

The PSV can be further utilized to reduce the conductance of FRE 115 between process chamber 114 and DGIC 630 (FIG. 1). Smaller FRE 115 conductance increases the pressure gradient between process chamber 114 and DGIC 630 with several fold advantages. First, a better suppression of backflow is established. Second, at any given flow, the pressure gradient across process chamber 114 is reduced. Finally, the DGIC is better defined and the requirements for draw flow radial uniformity are relaxed. However, in the embodiment of FIGS. 3 and 4, the range for narrowing the gap between 804 and 205 which defines the conductance of FRE 115 is limited by the need to provide a convenient path for wafer transport. However, in the embodiment presented in FIGS. 5 and 6, the constraint of the wafer-loading path is removed with the implementation of a gap-controlling PSV. As illustrated in FIG. 5, the gap-controlling PSV implements a convex lower surface 880 on the bottom of a wider poppet 856' to narrow the gap 206 between 880 and chuck 205. The resulting conductance of gap 206 can be as low as necessary since, as shown in FIG. 6, when the PSV is opened to facilitate wafer transport, gap-controlling surface 880 is raised and therefore does not interfere with the transport path. Gap-shaping portion 880 of PSV poppet 856' is preferably shaped with a down-looking substantially convex smooth continuation of part 804 to minimize flow disturbance.

To facilitate the gap-controlling PSV, the inner sealing gaskets and gasket grooves 872' and 873' are relocated as illustrated in FIG. 6. Likewise, top sealing surface 870' is relocated.

Figure 7:
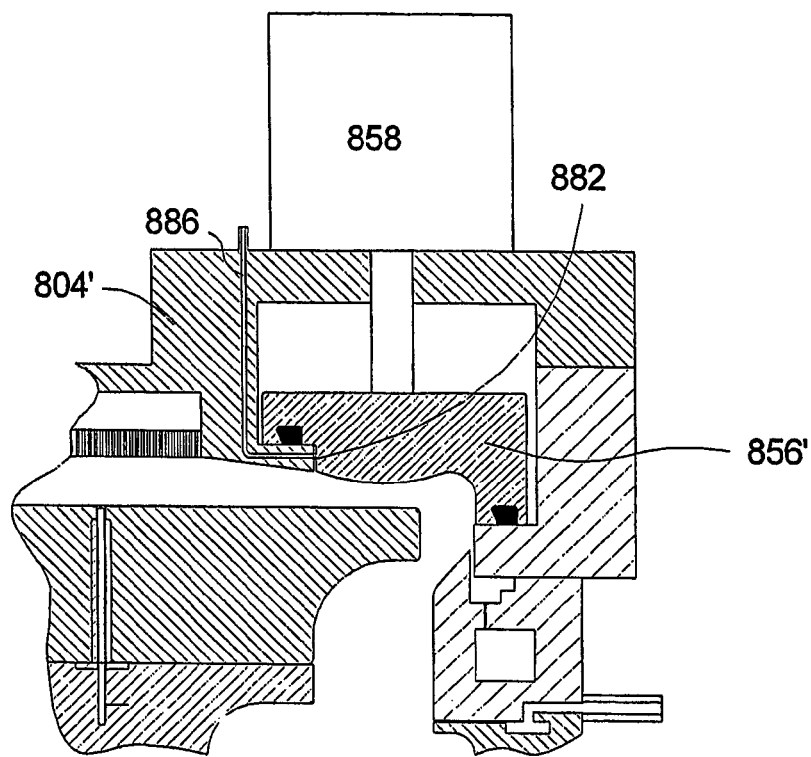
FIG. 7 highlights the seal area of a gap-controlling perimeter slot valve showing the seal purge line.

In the PSV embodiment displayed in FIG. 3, crevices 882 and 884 next to sealing gaskets are effectively shielded from the ALD precursors by the high flow of inert gas in the DGIC. As taught above this is the crucial feature that enables the implementation of, otherwise practically useless, PSV for the SMFD ALD apparatus. However, in the gap-controlling PSV embodiment (FIG. 5), the gap of the inner seal is located inside process chamber 114 and therefore is no longer protected. Accordingly, entrapment of ALD precursors can adversely impact the memory of the ALD chamber and can lead to fast deterioration of the inner seal and respective crevice if growth of inferior films in the gap is not suppressed. To overcome this problem, the gap 882 must be purged with a slow flow of inert gas during chemical dose. FIG. 7 illustrates schematically the seal area of the PSV. Only the right side of a cross-sectional view is shown. Gap 882 between poppet 856' and top 804' is purged through a delivery line 886 that is machined into the body of part 804'.

Figure 8:
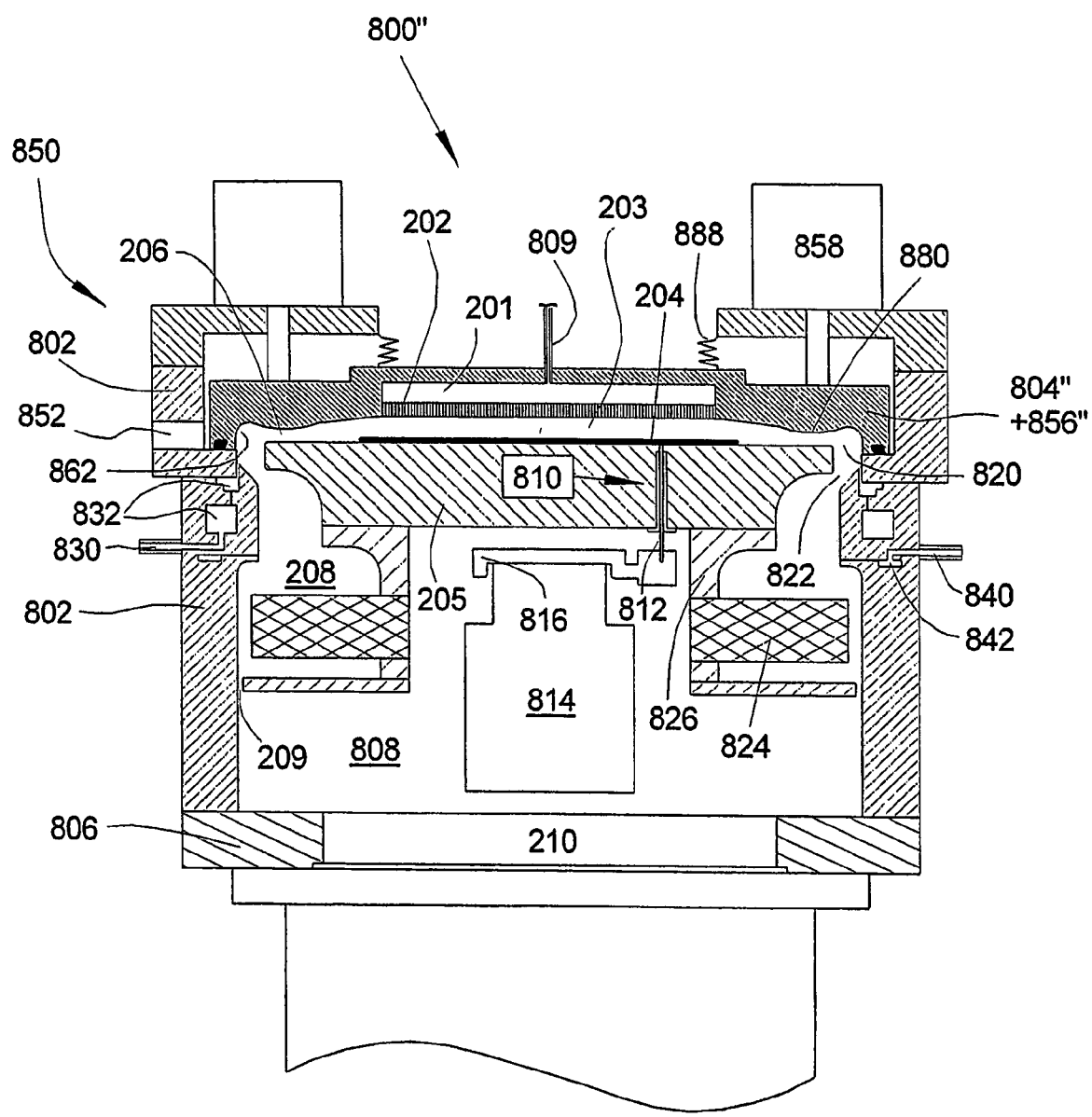
FIG. 8 depicts schematically a semi-perimeter slot valve at the close position in accordance with the invention.

In another embodiment illustrated in FIG. 8, the inner seal of the PSV is completely eliminated and poppet 856' forms a solid assembly with top part 804". Bellow 888 allows the entire assembly to elevate when the Semi PSV (SPSV) is moved to the OPEN position. In this case, purge gas connection line 612 and the connections of chemical sources 105 and 105' (FIG. 1) are made flexible to accommodate an ~12 mm of vertical motion. Accordingly, flexible hoses, bellows, or high purity Teflon line sections are implemented. It is appreciated that other means for retaining vacuum integrity while providing motion for 856"+804" assembly can substitute for the bellow seal shown in FIG. 8 without deviating from the scope of this invention.

Figure 9:
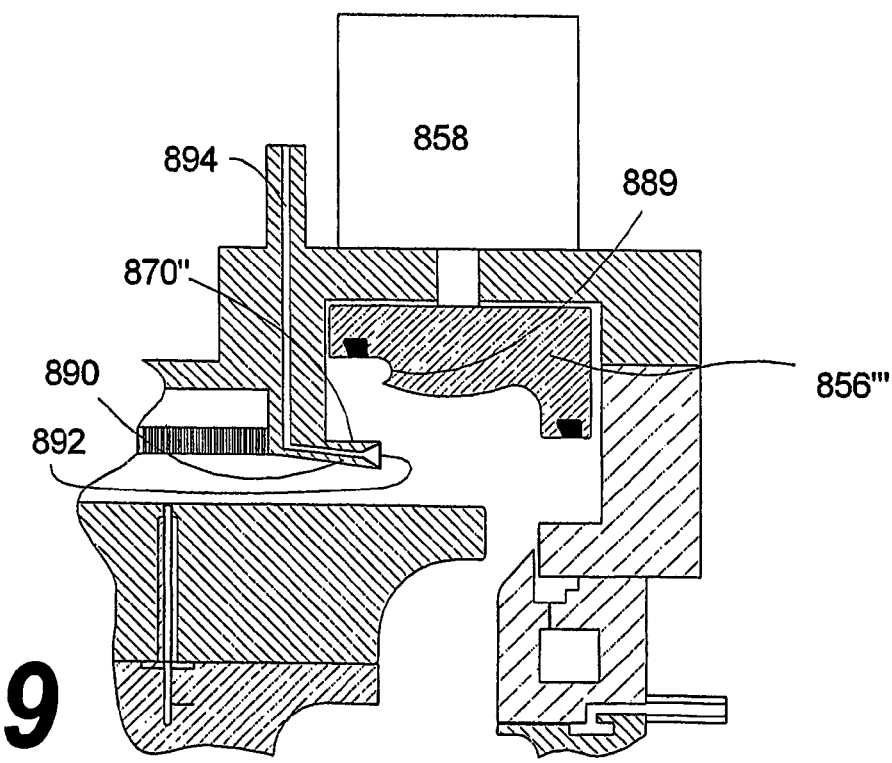
FIG. 9 highlights in schematic form a design for inflatable seal element shown deflated in accordance with the invention.
Figure 10:
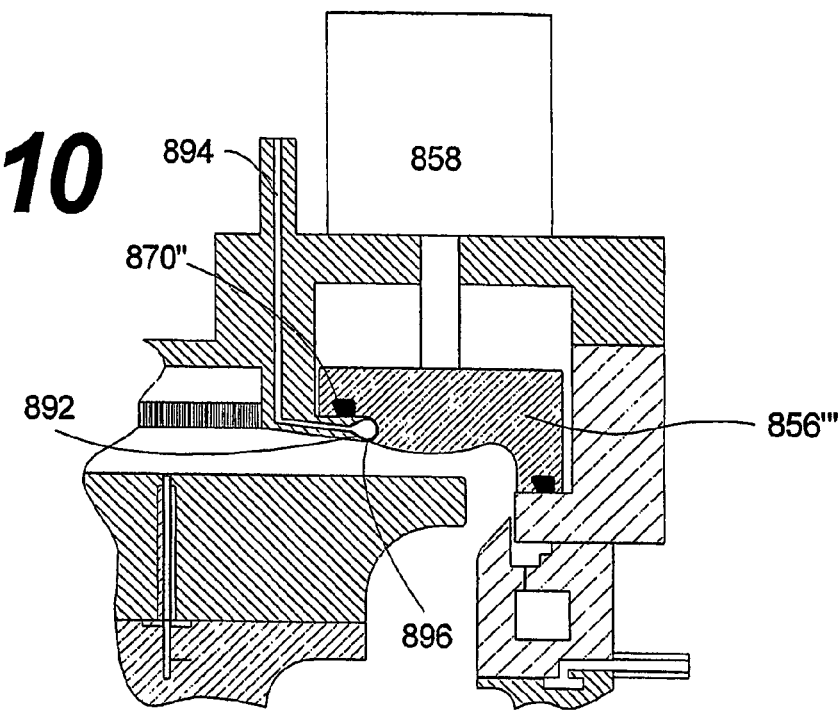
FIG. 10 highlights in schematic form a design for inflatable seal element shown inflated in accordance with the invention.
Figure 11:
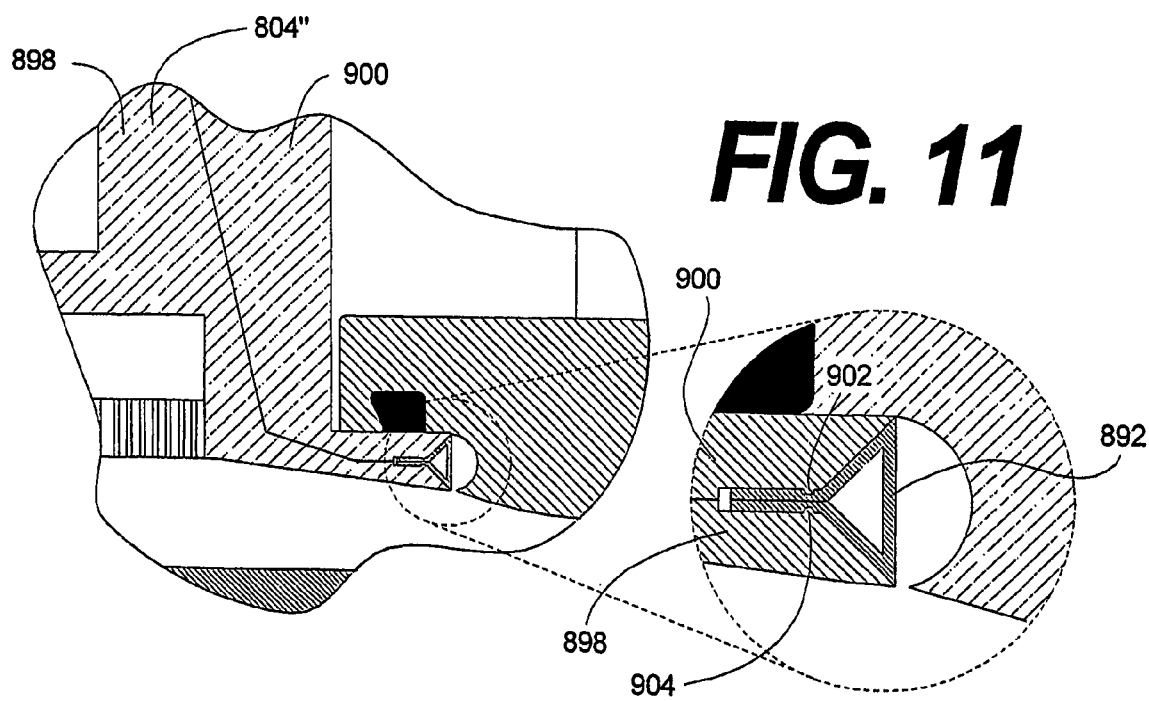
FIG. 11 illustrates the inflatable seal assembly (with reference to FIG. 10) in accordance with the invention.
Figures 12, 13:
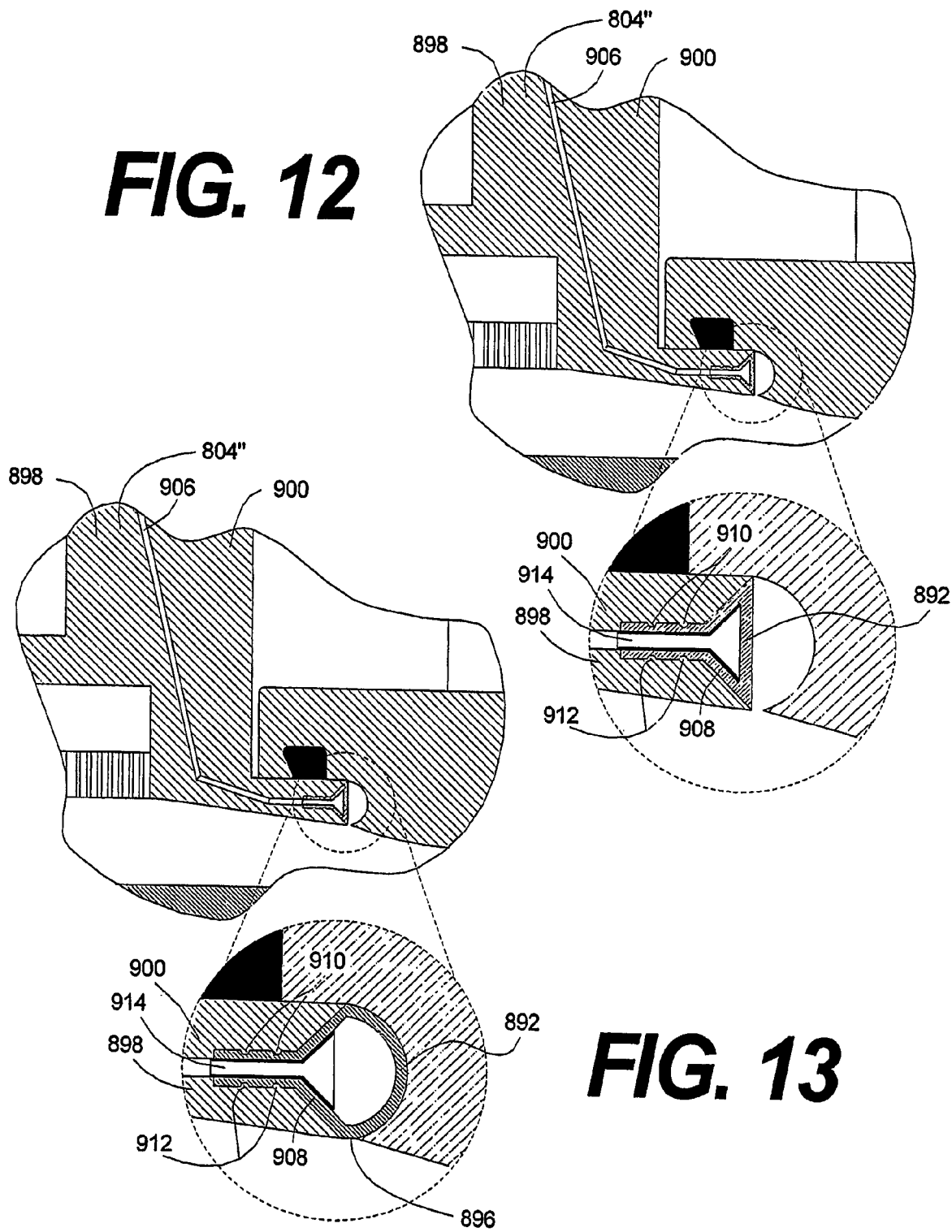
FIG. 12 illustrates the inflatable seal assembly (with reference to FIG. 10) showing the inflation gas line and the connection with the inflatable seal in accordance with the invention.
FIG. 13 depicts the same inset as in FIG. 12 where the seal is shown inflated in accordance with the invention.

Another embodiment that is well-suited to eliminate the pitfalls of crevice 882 associated with the inner PSV seals is presented in FIGS. 9, 10, 11, 12, and 13. In this embodiment, crevice 882 is protected by an inflated elastomer seal. The elastomer seal is made, for example, from suitable materials such as Viton, Kalrez, Chemraz, or equivalent and is mounted inside ledge 890 located under seal surface 870". When the PSV is at the upper position (PSV OPEN), elastomer 892 is not inflated as shown in FIG. 9. When the PSV is at the lower position (PSV SHUT), elastomer 892 is inflated by applying inert gas or air pressure through conduit 894. As a result, inflated elastomer 892 creates a seal against an appropriately shaped surface on poppet 856'''. For example, FIG. 9 depicts a concave shaped portion 889 of 856''' that accommodates the curved shape of inflated seal 892. Following this inflation, crevice 882 is eliminated and only a small portion 896 of inflated seal 892 is exposed to the process (FIGS. 10 and 13). In one preferred embodiment of this invention, the inflated seal is made from a slightly permeable elastomer. Inflation with inert gas results in a slow flow of inert gas through the elastomer at exposed area 896. Accordingly, this inert gas flow suppresses the growth of films on exposed area 896 during process. In another alternative embodiment, the elastomer is appropriately perforated at the 896 area to provide a path for inert gas flow and protection to area 896 from process chemicals.

Inflated elastomer seal 892 can be implemented in many different designs according to this invention. For example, FIGS. 11 and 12 illustrate a specific preferred design. Part 804" is split into an inner portion 898 and an outer portion 900. Appropriately-shaped elastomer seal 892 is folded and pressed between 898 and 900 and sealed into a substantially triangular-shaped tube by the pressure of upper and lower sealing ledges 902 and 904, respectively (FIG. 11). Inflation path 906 is machined into one or both of inner and outer parts 898 and 900 as depicted in FIG. 12. Against that path, elastomer 892 is appropriately shaped to conform around a metallic ferrule 908. The pressure of sealing ledges 910 and 912 seals the elastomer over ferrule 908 and in communication with inflation channel 906. Accordingly, an inflation/deflation path 914 is created. FIG. 13 displays a larger view of seal 892 after inflation.

Figure 14:
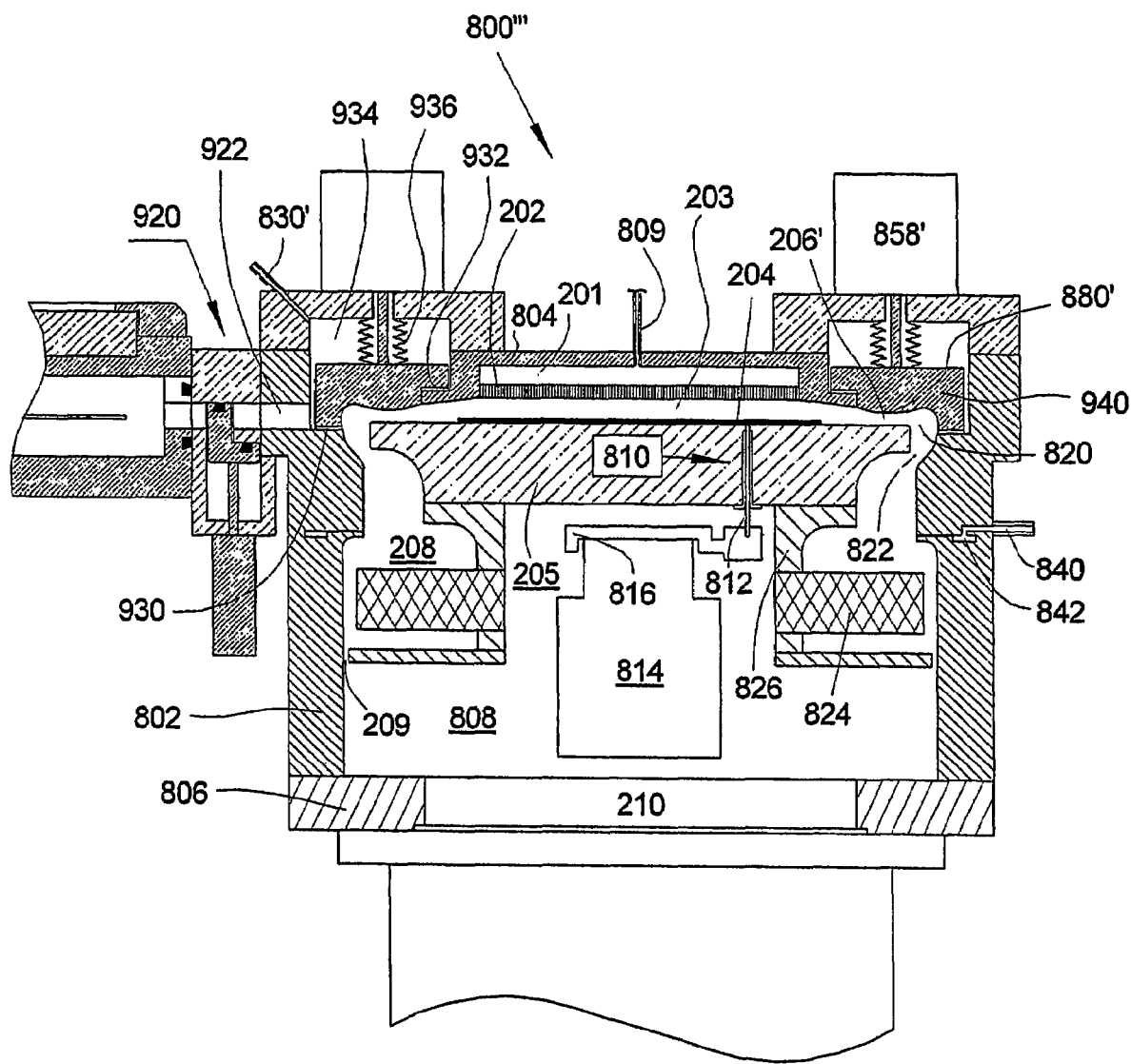
FIG. 14 depicts a translatable liner in accordance with the invention.

In another embodiment SMFD ALD apparatus is implemented with a sliding liner that replaces the PSV in providing symmetrical and dead-leg free ALD processing space. FIG. 14 illustrates a preferred embodiment wherein a radially shaped sliding liner is translatable to determine both the draw control plenum and the DGIC. The sliding liner 940 is depicted in the process position. In process position the sliding liner creates well defined and well restricted flow paths 930 and 932 that are used to deliver the inert gas draw flow into DGIC 820 during chemical dose. During process the entire volume 934 behind liner 940 is pressurized with inert gas through inlet 830'. This volume includes the slit-valve related cavity 922. Accordingly, a well-optimized draw flow plenum and FRE gap 206' are established. In addition, a slit-valve cavity 922 created by the interface with planar slit-valve 920 has no adverse impact on the ALD process and is protected from the growth of inferior deposits. When the chamber is set to facilitate wafer transport, the sliding liner is removed from the loading path 922 using actuator 858' while bellows 936 preserve the vacuum integrity of space 934.

Figure 15:
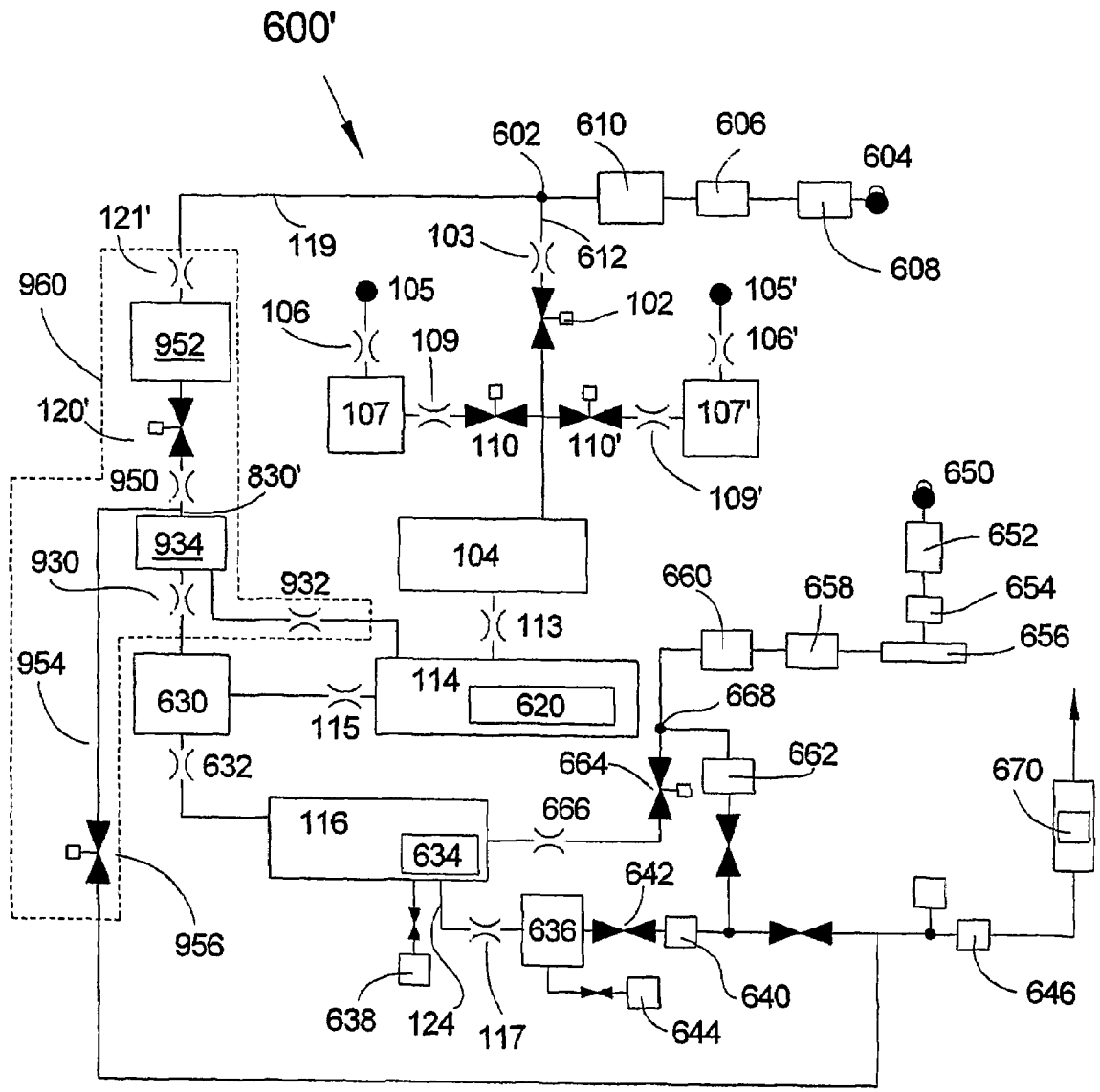
FIG. 15 depicts a flow diagram of a basic embodiment of a synchronously modulated flow-draw ("SMFD") ALD system comprising a sub-manifold for high-speed introduction and removal of draw control flow in accordance with the invention.

The preferred SMFD ALD method implements liner 940 (FIG. 14) in conjunction with a sub-manifold that enables high-speed draw flow control in spite of a substantial volume related to space 934. For example sub-manifold 960 depicted in FIG. 15 is used to vary the pressure within 934 quickly to facilitate fast variation of DC flow into DGIC 630 (820 in FIG. 14). Preferably, the flow restriction of FRE 930 and FRE 932 are selected to direct the majority of the draw control flow through FRE 930. When valve 120' is shut, the booster volume 952 is pressurized to substantially reach the pressure at point 602. FRE 950 is substantially less restrictive than FRE 121'. Accordingly, when valve 120' is opened the flow into space 934 resembles a high flow determined by the flow through FRE 950 that levels off into a substantially lower flow that is mainly dictated by FRE 121'. The high flow leading edge facilitates quick pressure increase within space 934 to initiate fast turn "on" of draw control gas. To facilitate fast turn "OFF" of draw control gas the combination of shutting valve 120' off and opening evacuation valve 956 is implemented to quickly reduce the pressure within space 934. In the preferred method the evacuation valve 956 is maintained open to reduce the pressure within space 934 down to a pressure that is still slightly higher than the process pressure to facilitate minimal flow of inert gas through both FRE 930 and FRE 932 during purge. The design of liner 940 must comply with basic SMFD design requiring that the pressure in the DGIC 630 will not be able to exceed the pressure in the process chamber 114. This requirement set's an upper limitation on the pressure rise rate within DGIC 630 not to exceed the typical 34 msec residence time within ALD chamber 114.

SMFD advantageously lends itself to some simplified chemical source apparatuses and methods. In particular, the ability of SMFD to dose vaporized liquid and solid chemicals without a carrier gas is compatible with a simplified pressure-controlled chamber source where the vapor pressure of the chemical can be accurately controlled as described in the exemplary embodiments below. Accordingly, the difficulty to control the partial pressure from chemical precursors in the flow of carrier gas is circumvented. Several different SMFD sources are depicted in FIGS. 16, 17, 18, 19, 20, 21 and 22. Source chamber volume is chosen to improve pressure-stability and to compensate for the slow response of the pressure control device or method that is typically limited within the 1-10 seconds range. Accordingly, it is advantageous to ensure that source chamber capacity (i.e., in liter×Torr) is substantially larger than the material delivered per cycle. For example, source capacity that is 20 times to 100 times larger than the capacity loss per dose lends itself to a minimized pressure ripple in the source chamber, i.e., 316 in FIG. 18, within 1% to 5%, which is tested to have indistinguishable impact on the consistency and length of the chemical dose. Pressure control devices cannot follow the speed of SMFD dose cycles. Rather, as detailed herein, these pressure controlling devices or methods are preferably set to control the average pressure in the source chamber while the capacity within the source is set to smooth out significant ripples. Therefore, the volume of the source is chosen to limit pressure fluctuation, as necessary.

Figure 16:
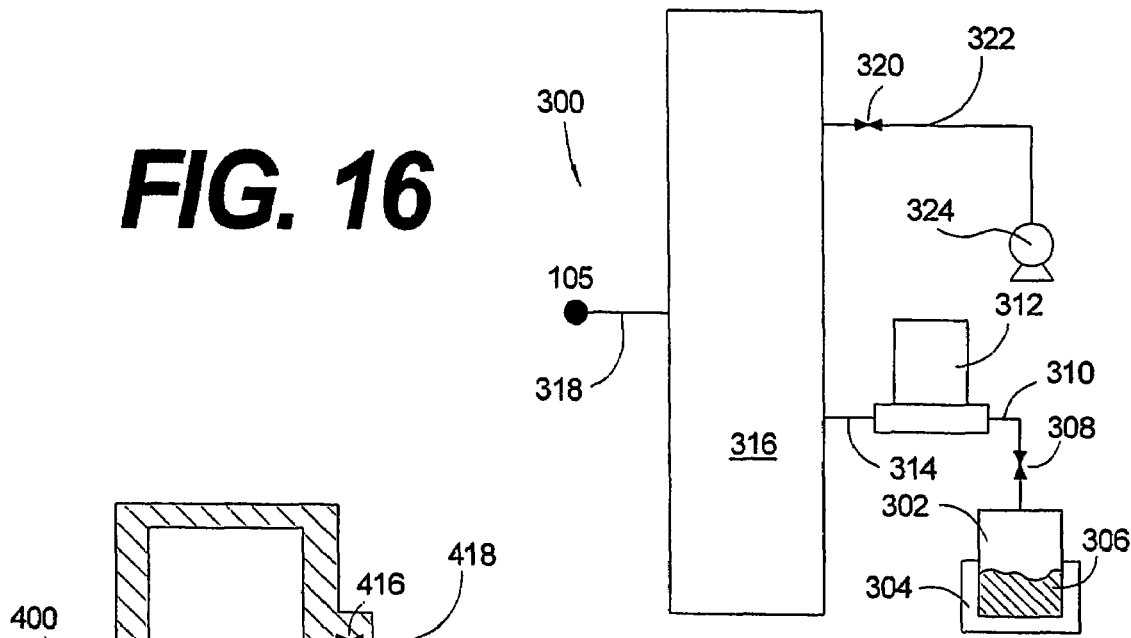
FIG. 16 depicts schematically a pressure-controlled source for gas and volatile liquid and solid precursors in accordance with the invention.

Several pressure control methods are described in FIGS. 16, 17, 18, 19, 20, 21 and 22. In FIG. 16, a relatively high vapor pressure from liquid or solid chemical 306 is controlled by a commercially available pressure controller 312 such as the MKS Instruments 640A series which is limited to operation temperature in the range from 0° C. to 50° C. The chemical is located at a separate container 302 and is heated or cooled per temperature control element 304 to provide a pressure, $P_{chem}$, that is larger than the pressure that is needed in source 316. This pressure is fed into the inlet of pressure controller 312 that controls the pressure inside source chamber 316. A shut-off valve 308 is preferably placed between chemical container 302 and pressure controller 312 to terminate chemical supply through conduit 310 when processing is complete. Correct choice of appropriate pressure controller and chemical temperature ensures stable and consistent chemical delivery. In particular, the choice of pressure controller conductance must be suitable for the necessary flow under given pressure conditions as known in the art and described, for example, in the user manual of the 640A pressure controllers from MKS Instruments. The temperature of source 300, including gas line 310 interconnecting the chemical container with the pressure controller, pressure controller 312, the gas line 314 interconnecting the pressure controller and source chamber 316, and gas line 318 interconnecting the source chamber with the SMFD-ALD manifold at source points 105 and 105' (FIG. 1) must be maintained at a temperature adequately high to prevent condensation of the precursor chemicals, as known in the art. Source evacuation is accomplished through utility valve 320, conduit 322, and vacuum pump 324.

Figure 17:
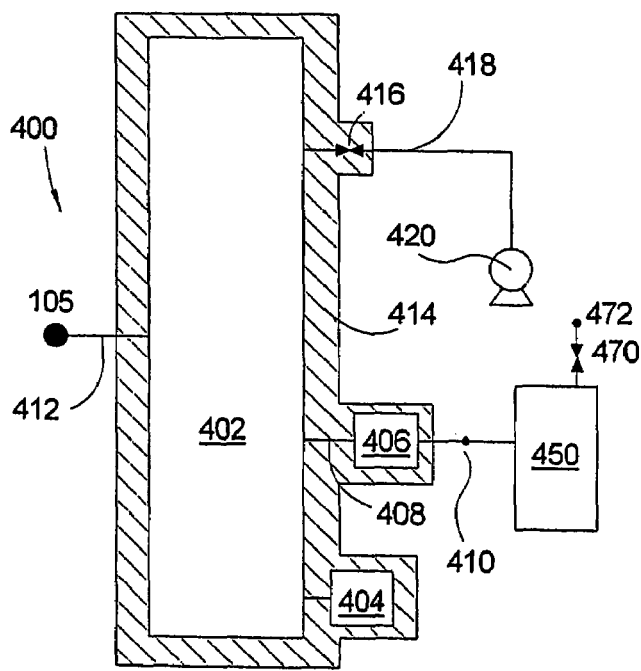
FIG. 17 depicts schematically a pressure-controlled source for non-volatile liquid precursors in accordance with the invention.
Figure 18:
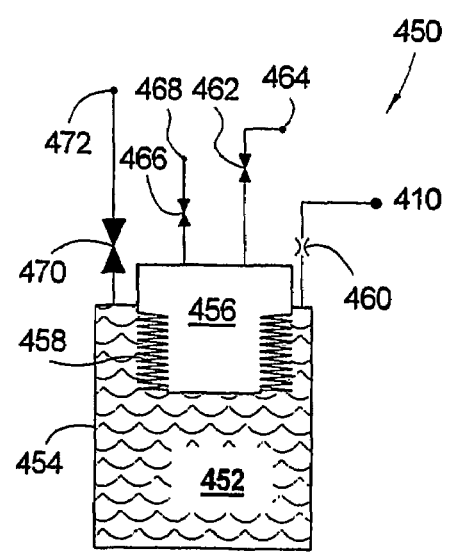
FIG. 18 depicts schematically a liquid delivery source in accordance with the invention.

In another embodiment, 400, depicted in FIG. 17, consistent and controlled pressure from relatively non-volatile liquid chemicals is achieved by applying liquid delivery techniques to deliver the precursor with precision into a vaporizing chamber. Vaporization chamber 406 is connected to source chamber 402 through heated gas line 408. The pressure is monitored at the source chamber using a conventional pressure gauge 404 such as the model 628B or the model 631A Baratron manufactured by MKS Instruments, which are suitable to reliably measure the pressure of chemicals and can be maintained at temperatures of 100° C. and 200° C., respectively, to prevent condensation of non-volatile chemicals. Vaporized precursor is delivered to chemical source point 105 through conduit 412. The entire assembly downstream from vaporizer 406 is controlled at a temperature suitable to prevent condensation of the chemical. In certain embodiments, the temperature of vaporizer 406 is controlled separately and independently to improve vaporization efficiency, speed, and control. Valve 416 is utilized to evacuate the source chamber through conduit 418 and vacuum pump 420.

Liquid delivery control system 400 does not need to accommodate the ALD dose response, but rather to be able to sustain a consistent delivery over a longer time scale. However, most commercially available liquid delivery systems are not suitable to deliver such small quantities as required for ALD practice that are in the order of $10^{-4}$ cc/cycle. In the case of SMFD with ~2 cycles/sec, the liquid delivery system must be able to precisely control flow on the order of 0.012 cc/min. This minute chemical flow is in the low range of, for example, top-of-the-line DLI-25C system manufactured by MKS Instruments (low limit of 0.006 cc/min). In addition, to maintain the volume of the source chamber conveniently small, the liquid delivery system must accommodate a relatively fast start/stop operation, preferably on the order of a cycle time which is difficult to achieve with commercially available technology. An embodiment that accomplishes consistent delivery of small liquid flow with fast response is described with respect to the schematic illustration given in FIG. 18.

Liquid delivery system 450 implements container 454 that is filled with liquid precursor 452 from chemical line 472 through inlet valve 470. Line 472 is connected to a liquid filling line (not shown) that draws liquid precursor from a chemical reservoir such as the EpiFill system from Epichem, Inc. A variable air chamber 456 completes the makeup of container 454 with a flexible bellow 458. The liquid can be pressurized by introducing air from pneumatic line 464 through valve 462 into air chamber 456 to force chamber 456 to expand downwards and pressurize the liquid. The liquid can be depressurized by evacuating the pressurized air out of chamber 456 through valve 466 into line 468. Accordingly, the liquid can be pressurized and depressurized within 5 msec to 50 msec with standard solenoid valves. Variable orifice 460, for example, a proportional valve, is used to set the flow of liquid towards outlet 410 when the liquid is pressurized. When metallic bellow 458 approaches maximum extension, container 454 is automatically refilled. For example, bellow 458 approaches the bottom of container 454 where a magnetic proximity sensor is mounted. A magnet inside chamber 456 is sensed at proximity and the system will refill container 454 within the next idle time. The proximity sensor is designed to sense the need for refill when system 450 is still capable of delivering enough chemical for an entire interval between idle times. Alternatively, two liquid delivery systems 450 may be connected to a single source 400 and alternately serve and refill. Refilling is accomplished by depressurizing chamber 456 and pushing liquid through valve 470 to retract bellow 458 and refill container 454.

Solid chemicals present several source design challenges. In particular, the inconsistency of evaporation rate from solid chemicals due to fluctuation in the area of the solid material makes seeding vapors from solid source into carrier gas expensive and unreliable. In addition, thermal contact of solid chemicals usually in a shape of fine-grain powders is typically poor leading to significantly inefficient and slow sublimation rates. Accordingly, it is very difficult to maintain consistent and non-depleted supply of vaporized molecular precursors from solid sources. This difficulty applies for both pure vapor form or as partial pressure within a carrier gas.

Figure 19:
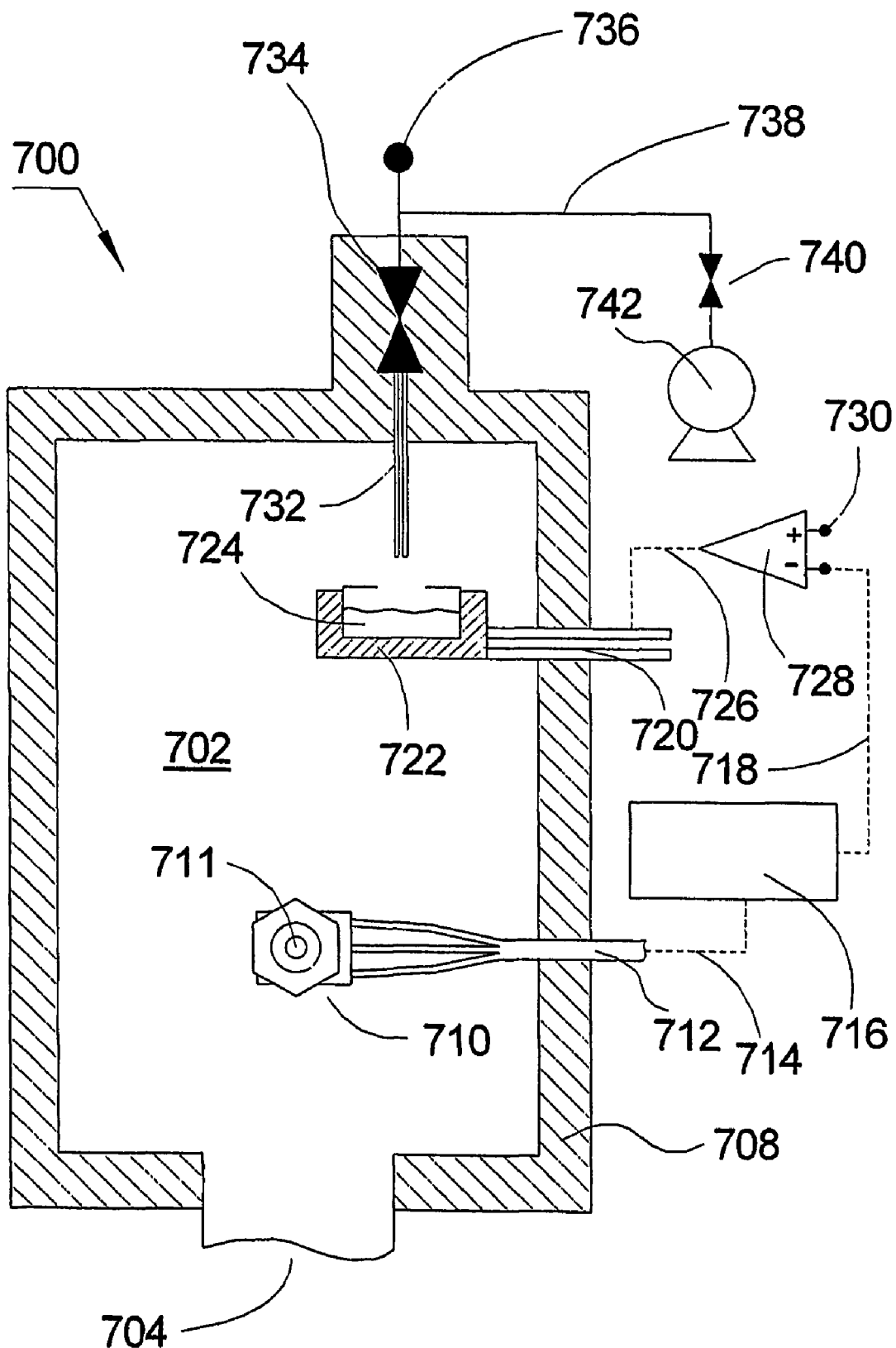
FIG. 19 depicts schematically a chemical source implementing a sensor that monitors the accumulation of materials such as a QCM for the measurement and control of chemical vapor pressure in accordance with the invention.

An embodiment 700 disclosing a vapor source from solid chemicals is described here with reference to FIG. 19. The source implements a technique to monitor the condensation rate of condensable materials for indirectly evaluating the vapor pressure of this condensable materials. A temperature controlled sensor 710 senses the accumulation of materials on it's sensing surface 711. Sensor 710 is preferably a Quartz crystal Microbalance (QCM), a Surface Acoustic Wave (SAW) device sensor, or other thickness monitoring devices or techniques. Sensor 710 continuously indirectly probes the vapor pressure of the molecular precursor in the following manner: The molecular precursor is sublimated using resistive heating or other suitable means to maintain a minimal growth rate of condensed film of molecular precursor on the material accumulation sensor, e.g. a QCM in the preferred embodiment. Hereinafter, a QCM is used as the exemplary sensor, though it should be understood that other sensors can be used. The QCM sensor is prevented from having a line-of-sight with the sublimation source and therefore the growth of condensed film on it represents condensation of excessive vapor pressure. The temperature of the entire source, 708, with the exception of the QCM sensor is maintained sufficiently high to prevent condensation at the desired precursor vapor pressure. Commercially available QCM sensor heads are capable to control the deposition or condensation of films on their exposed area with a rate typically better than 2% of a monolayer per second. To facilitate the desired vapor pressure, the temperature of the QCM sensor is maintained by a sensor temperature control system 713 at a pre-selected temperature. The pre-selected temperature for the sensor is several degrees lower than the condensation temperature of the molecular precursor at the desired controlled vapor pressure. Accordingly, by controlling the sublimation source to sustain a minimal condensation rate on the QCM sensor the molecular precursor is maintained at a desired, substantially-controlled, vapor pressure. Commercially available deposition controllers and sublimation sources are proven to be able to reach well-controlled deposition rates within several seconds. Accordingly, source 700 is capable to go from a standby mode wherein the vapor pressure of the molecular precursor is insignificant to a process mode wherein the desired precursor vapor pressure is maintained inside the source within several seconds. Source 700 is also capable to replenish the molecular precursor in the source on a time-scale of several seconds. Accordingly, a source with a well designed capacity that accommodates only minor pressure drop during ALD dose, as described above, is well suitable for high-productivity ALD applications. With only seconds required to cross from idle source with negligible vapor pressure to "active" source with appropriately controlled vapor pressure the source is practically set to idle in between successful wafer processing. During a typical semiconductor wafer processing of 3 minutes or less the condensation on the QCM will accumulate only several monolayers. This negligible thickness will be sublimated away from the QCM surface during idle mode.

Source chamber 702 is connected to source point 704 (equivalent to 105 and 105' in FIG. 1) through an appropriately heated conduit (not shown). The volume of source chamber 702 is chosen to reduce pressure fluctuations and to accommodate the capabilities of commercially available deposition controllers and sensors as described above. The source is equipped with a temperature controlled QCM sensor 710 having a sensing area 711. For example the BSH-150 Bakeable sensor head available from Maxtek, Inc. that is proven to work reliably in the temperature range from 30-300° C. The temperature of sensor 710 is tightly controlled using a combination of resistive heating and air-flow cooling. Preferably the temperature of the sensor 710 is controlled within better than ±0.1° C. to suppress sensor fluctuations and drift. Sensor 710 is preferably modified to seal access to the back side of the quartz crystal microbalance using, for example, Viton cement or other complying adhesives with high temperature compatibility as well as commercially available high temperature elastomer seals such as Kalrez O-rings or equivalents.

Sensor 710 is monitored by deposition controller 716 such as commercially available MDC360C from Maxtek, Inc. or the IC/5 controller available from Inficon. The QCM is capable of measuring thickness with better than 0.1 Å resolution that is equivalent to better than 4% of a monolayer of most materials. Likewise, commercially available deposition controllers are capable of controlling the power to evaporation sources to maintain a selected deposition rate with as low as 2% of a monolayer per second.

Source 702 is also equipped with an evaporation/sublimation source 722. For example resistively heated crucible 722 containing a powder of molecular precursor 724 such as $HfCl_4$. The sublimation source is mounted within source 702. Electrical-current feedthroughs 720 are used to feed power to provide quick heating of crucible 722. Commercially available crucibles are proven to be able to initiate well controlled thermal evaporation/sublimation of various materials within a time scale of seconds when feedback controlled to sustain a preset reading on a deposition rate sensor such as sensor 710. For example the feedback loop schematically illustrated in FIG. 19 with comparator 728, control lines 718 and 726 and set-point 730. In the case of chemical source 700, sensor 710 preferably does not have a line of sight with the vapors emerging from sublimation source 722.

Source 700 also includes a refill valve 734 and a refill conduit 732. To replenish the source chemical, for example $HfCl_4$ powder, the powder is preferably immersed within an inert liquid to generate a slurry. The chemical is loaded into an idle, vented and preferably cold (i.e. room temperature) source 700 from point 736 by opening valve 734. Following the delivery of a metered amount of slurry valve 734 is flush with sufficient amount of inert liquid to flush the powder from the valve prior to shutting the valve off. The source is then evacuated and the inert liquid is subsequently evaporated using vacuum pump 742 through valves 734 and 740 and line 738. For this operation slurry-source manifold and vent manifold that are connected at point 736 are isolated using appropriate shut-off valves (not shown). During inert liquid evaporation the sublimation source may be slightly heated to promote rapid removal of the liquid.

The solid material is preferably introduced as a thoroughly mixed slurry of fine powder solid chemical with an inert, highly volatile liquid such as freon, carbon tetrachloride ($CCl_4$), trichloroethylene, or Galden HT55 from Solvag Solexis, to name a few alternatives. The liquid is used to shield the precursor from ambient exposure during transfer since most precursors react violently with moisture and/or oxygen. A slurry is better suited than a solvent since it is more generic. In addition, solvated precursor can still react with the ambient while wet, and immersed solid particles in a slurry are practically isolated from contact with the ambient. A slurry is also easier to dry-out completely from all trace of liquid.

Figure 20:
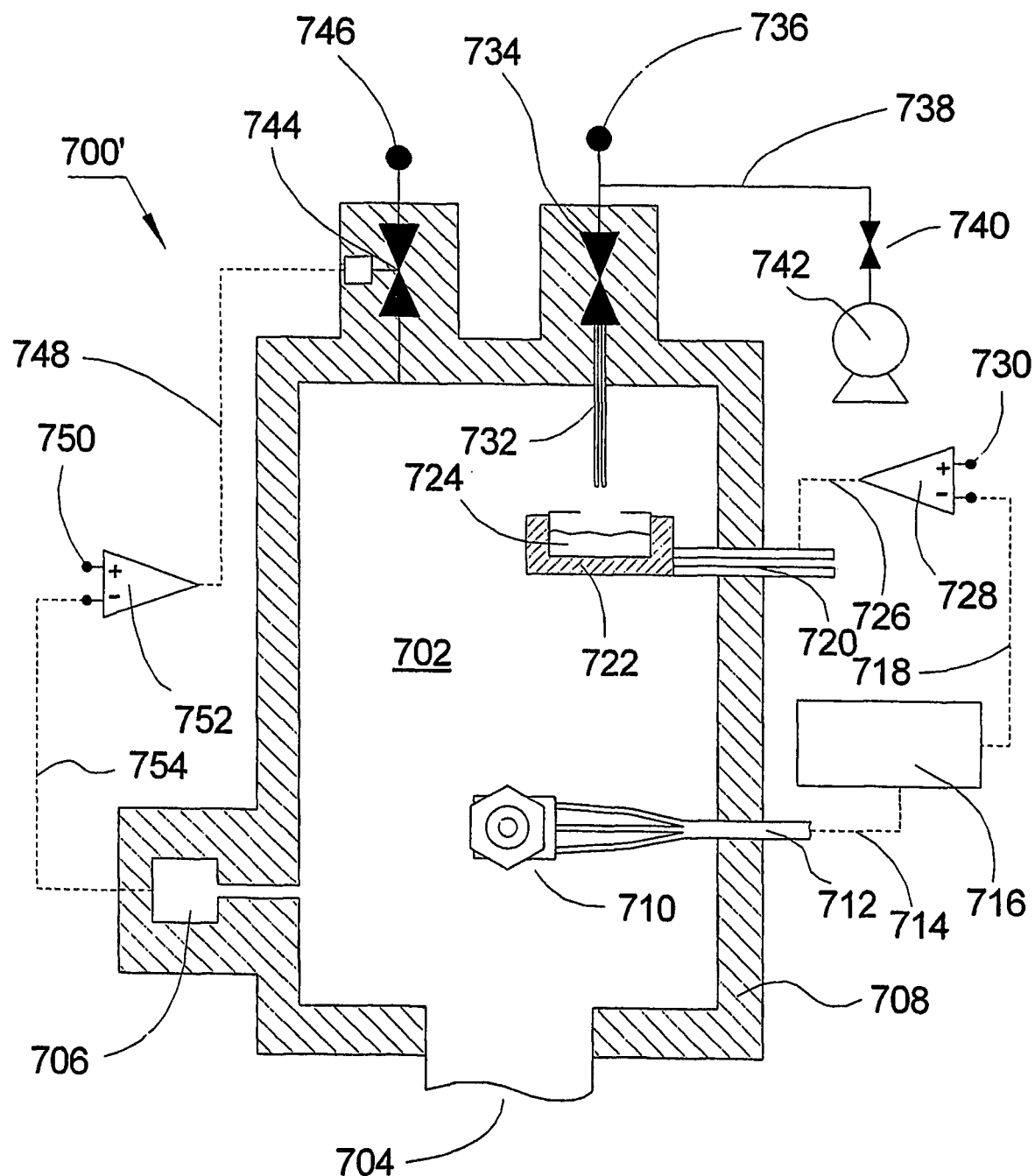
FIG. 20 depicts schematically a chemical source implementing a QCM for the measurement and control of chemical vapor pressure and an independent total pressure control in accordance with the invention.

The source 700 illustrated in FIG. 19 can appropriately control the pressure of a solid as well as liquid chemical with consistency that is well suited for ALD. In another embodiment, source 700' that is illustrated in FIG. 20 controls both the partial pressure of a solid precursor or a liquid precursor as well as the total pressure of precursor diluted within inert carrier gas. For this purpose the partial pressure of precursor is maintained and feedback controlled using the combination of sensor 710 and sublimation/evaporation source 722 and an appropriate deposition controller 716 as described above with reference to source 700 in FIG. 19. In addition, high-temperature pressure gauge 706 and valve 744 are used to deliver inert gas from inert gas manifold 746 to maintain source volume 702 at a controlled total pressure. Shutoff valve 744 is feedback controlled to maintain set-point total pressure 750. Alternatively, high temperature proportional valve in combination with shutoff valve 744 may be used. The total pressure is controlled to exceed the vapor pressure from the chemical. Since the additional gas in not condensable at the temperature of the QCM, the QCM is able to control the partial pressure of the chemical independent of the total pressure.

Source 700' advantageously allows to prepare and sustain a well controlled mixture of reactive chemical vapor seeded into inert carrier gas wherein both the partial pressure of the precursor and the total pressure are independently controlled. In addition, source 700' can be used for in situ preparation of precursor. Accordingly source 700' is operated in an etch mode wherein the gas supplied from manifold 746 contains an etch gas such as $Cl_2$, $Cl_2/O_3$, HF etc. or a well-optimized mixture of etch gas with inert gas. The sublimation source 722 contains a metallic powder or otherwise a compound suitable for effective generation of volatile etch product (such as $RuO_2$ suitable to generate Ru(VIII) oxide or ruthenium oxichlorides). The temperature of crucible 722 is controlled to promote efficient reaction of etch gas with the target material 724 to generate the desired molecular precursor. Using this method eliminates the need to handle and contain hazardous chemicals within source 700' and in the slurry manifold. In addition, metallic sources are usually available at substantially higher purity than compound chemicals and at substantially lower cost. Additional advantage comes from the ability to generate metastable precursor molecules which are otherwise difficult to store such as the oxichlorides of Ta, Nb, W, Hf, Zr, Ru etc. as well as volatile precursors that are unstable and extremely hazardous such as $RuO_4$. For example, $HfCl_4$ may be generated from the combination of Hf powder within crucible 722 and a mixture of $Cl_2/N_2$ delivered from 746. The temperature of 722 is controlled to satisfy a low condensation rate of $HfCl_4$, clearly the most volatile etch product, on sensor 710. In an alternative method the precursor $HfOCl_2$ is generated from metallic Hf in 722 and a mixture of $Cl_2/O_2/O_3$ coming from manifold 746. In this case the volatile $HfOCl_2$ will be the dominant etch product at sufficiently high ratio of $O_3/Cl_2$. In yet another example $RuO_4$ is generated from $RuO_2$ loaded into 722 and $O_2/O_3$ delivered from manifold 746. In yet another example, volatile carbonyl molecules such as $W(CO)_6$ are prepared using W powder and CO gas.

In alternative embodiment source 700''' illustrated in FIG. 21 implements an alternative sublimation source 770 using metallic target 722 shaped as a wire (shown), rod, plate, foil etc. wherein the sublimation of in-situ prepared precursor from etching target 772 is promoted by running direct heating current through target 772 from transformer 778 that is controlled to maintain the desired low condensation of the precursor on sensor 710. In the configuration shown in FIG. 21 a high purity wire 772 is clamped using high purity metallic clamps 774.

FIG. 22 presents another exemplary embodiment wherein source 700'''' does not include a pressure gauge to control the total pressure within source 700'''' internal volume. Reliable pressure gauges such as the MKS 631A are available and can withstand harsh chemicals and temperature up to 200° C. These gauges are well suited for sources such as in 700' (FIG. 20) and 700'' (FIG. 21). However, in some cases sources temperature exceeding 200° C. may be desired. In addition, the combination of high-temperature and corrosive chemicals may accelerate drift and failure of pressure gauges such as the MKS 631A or the MKS 628B. Additionally, high temperature pressure gauges are rather expensive. In the alternative approach of FIG. 22 the total pressure is indirectly maintained by providing a well pressure controlled reservoir 780 upstream to valve 744'. The volume of reservoir 780 is sufficiently large to sustain well regulated pressure with the aid of an off-the shelf pressure controller 782 such as the MKS series 640A devices. The gas is fed at point 746' and maintained within reservoir 780. Following the completion of a dose from source 700'''' the total pressure is replenished by opening valve 744' for a duration sufficiently long to substantially bring the pressure within 700'''' internal volume to the pressure that is controlled within 780. Preferably, the opening of valve 744' is not timed excessively long to avoid diffusion of non-volatile precursor upstream of valve 744' where the temperature is not sufficiently high to prevent condensation. While the sublimation source shown in FIG. 22 resembles the source of FIG. 21 it is understood that the method for total pressure maintenance taught with reference to FIG. 22 is suitable for the embodiments and method that were presented in reference to FIG. 20 and their derivatives such as direct sublimation or in-situ precursor generation, as well.

The apparatuses for in-situ generation of precursors using the method that was described in reference to FIG. 20, FIG. 21 and FIG. 22 is suitable to prepare desired compound precursor molecules that are substantially more volatile than the pure element or other undesired compounds. Many different precursors can be prepared with substantial advantages ranging from stability, safety, consistency, purity and cost. Several examples are given below (for simplicity, the equations are not balanced):

$$Hf + Cl_2 \rightarrow HfCl_4 \uparrow \qquad (1)$$

$$RuO_2 + O_2 + O_3 + Cl_2 \rightarrow RuO_xCl_{4-x} \uparrow \qquad (2)$$

$$W + Cl_2 \rightarrow WCl_6 \uparrow \qquad (3)$$

$$Ru + CO \rightarrow Ru_3(CO)_{12} \uparrow \qquad (4)$$

$$Mo + Cl_2 \rightarrow MoCl_5 \uparrow \qquad (5)$$

Systems, apparatuses, and methods designed and operated in accordance with the invention are particularly useful in ALD technology. Synchronous modulation of flow and draw, SMFD, is also useful, however, in a wide variety of circumstances and applications. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense.

The invention claimed is:

1. A chemical source vapor pressure control system comprising:
   a chemical source chamber, a chemical source holder within said chemical source chamber for holding a solid or liquid chemical source, a chemical source heater, a source heater controller, and a deposition accumulation sensor, said heater controller electrically connected to said deposition accumulation sensor to control the heating of said source, said temperature controlled deposition accumulation sensor located out of line-of sight with said chemical source while it is electrically connected to said heater controller; and
   a sensor temperature control unit for controlling the temperature of said accumulation sensor to a temperature substantially equal to the condensation temperature of the chemical source at the desired vapor pressure.

2. A chemical source control system as in claim 1 wherein said source chamber has chamber walls and further comprising a chamber wall temperature control system for maintaining said walls at a temperature that is sufficiently high to prevent condensation of said chemical source.

3. The chemical source vapor pressure control system as in claim 1 and further characterized by a pressure gauge, a gas control valve, and a pressure controller connected between said gauge and said valve to control the total pressure within said source chamber to a pressure higher than said controlled vapor pressure of said chemical source.

4. The chemical source vapor pressure control system as in claim 1 and further characterized by a source of an etch gas connected to said gas control valve, and said sensor senses a condensable chemical which is an etching product.

5. The chemical source vapor pressure control system as in claim 4 and characterized in that said chemical source is selected from the group consisting of Hf, Zr, Ru, $RuO_2$, Si, W, Mo, Co, Cu, Al, Os, $OsO_2$, Fe, Ta and combinations thereof; and said etching gas is selected from the group consisting of $Cl_2$, $Cl_2/N_2$, $Cl_2/O_{2/O3}$, $N_2/HF$, $N_2/ClF_3$, CO, $CO/N_2$ and combinations thereof.

6. The chemical source vapor pressure control system as in claim 1 wherein said vapor control system is part of an atomic layer deposition (ALD) system and further characterized by a pressure controlled reservoir; a shutoff valve in series fluidic communication between said pressure controlled reservoir and said source chamber to substantially equalize the pressure between said source chamber and said pressure controlled reservoir between successive ALD doses.

7. The chemical source vapor pressure control system as in claim 1 wherein said source is applied for ALD and the capacity of said source chamber is 20 times or more larger than the capacity required for a single ALD dose.

8. A method for controlling the vapor pressure of a solid or liquid chemical source within a source space said method comprising:
   sensing the accumulation of said chemical on the sensing surface of an accumulation sensor;
   controlling the temperature of said chemical source depending on said sensed accumulation to control said vapor pressure; and
   controlling the total pressure in said source space to be higher than said vapor pressure of said chemical by adding a non-condensable gas to said source space.

9. A method as in claim 8 wherein said temperature of said chemical source is controlled to maintain a minimal measurable condensation rate on said sensing surface.

10. The method of claim 8 and further characterized by controlling the temperature of said sensor to determine the desired vapor pressure of said chemical.

11. The method of claim 8 and further characterized by introducing an etching gas into said source space; and etching an elemental or compound target to produce said chemical.

* * * * *